United States Patent
Kusunoki et al.

(10) Patent No.: US 6,980,942 B2
(45) Date of Patent: Dec. 27, 2005

(54) METHOD OF SIMULATION OF PRODUCTION PROCESS OF SEMICONDUCTOR DEVICE AND SIMULATOR THEREOF

(75) Inventors: Naoki Kusunoki, Tokyo (JP); Nobutoshi Aoki, Kanagawa-ken (JP); Hirotaka Amakawa, Kanagawa-ken (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 910 days.

(21) Appl. No.: 09/812,365

(22) Filed: Mar. 20, 2001

(65) Prior Publication Data

US 2001/0025233 A1 Sep. 27, 2001

(30) Foreign Application Priority Data

Mar. 24, 2000 (JP) .......................... P2000-085268

(51) Int. Cl.[7] ............................................. G06F 17/50
(52) U.S. Cl. ............................. 703/14; 703/2; 345/421; 716/20; 700/121
(58) Field of Search ............................. 703/2, 3, 6, 13, 703/14, 19

(56) References Cited

U.S. PATENT DOCUMENTS 5,386,374 A * 1/1995 Meng .......................... 716/20
5,586,230 A * 12/1996 Leon et al. .................. 345/420
6,192,330 B1 * 2/2001 Nakamura ..................... 703/13

FOREIGN PATENT DOCUMENTS

JP 09327616 11/1997
JP 11031248 2/1999

OTHER PUBLICATIONS

Kirchauer et al., Rigorous Three-Dimensional Photoresist Exposure and Development Simulation over Nonplanar Topography, IEEE Transactions on Computer-Aided Design of Integrated Circuits and Systems, vol. 16, No. 12, Dec. 1997, pp. 1431-1438.*

* cited by examiner

Primary Examiner—Russell Frejd
(74) Attorney, Agent, or Firm—Pillsbury Winthrop Shaw Pittman LLP

(57) ABSTRACT

Plural boundary points are generated on a string on the surface of a material and a first length of a line segment between the boundary points is obtained. Then, the displacement of the boundary point according to a process model and the boundary point is moved by the displacement. A second length of the line segment between the boundary points after the boundary point is moved is found. When the second length is greater than a value obtained by multiplying the first length by a first factor exceeding 1, a new boundary point is added to the line segment whereas when the second length is smaller than a value obtained by multiplying the first length by a second factor less than 1, one of the boundary points of the line segment is eliminated.

21 Claims, 23 Drawing Sheets

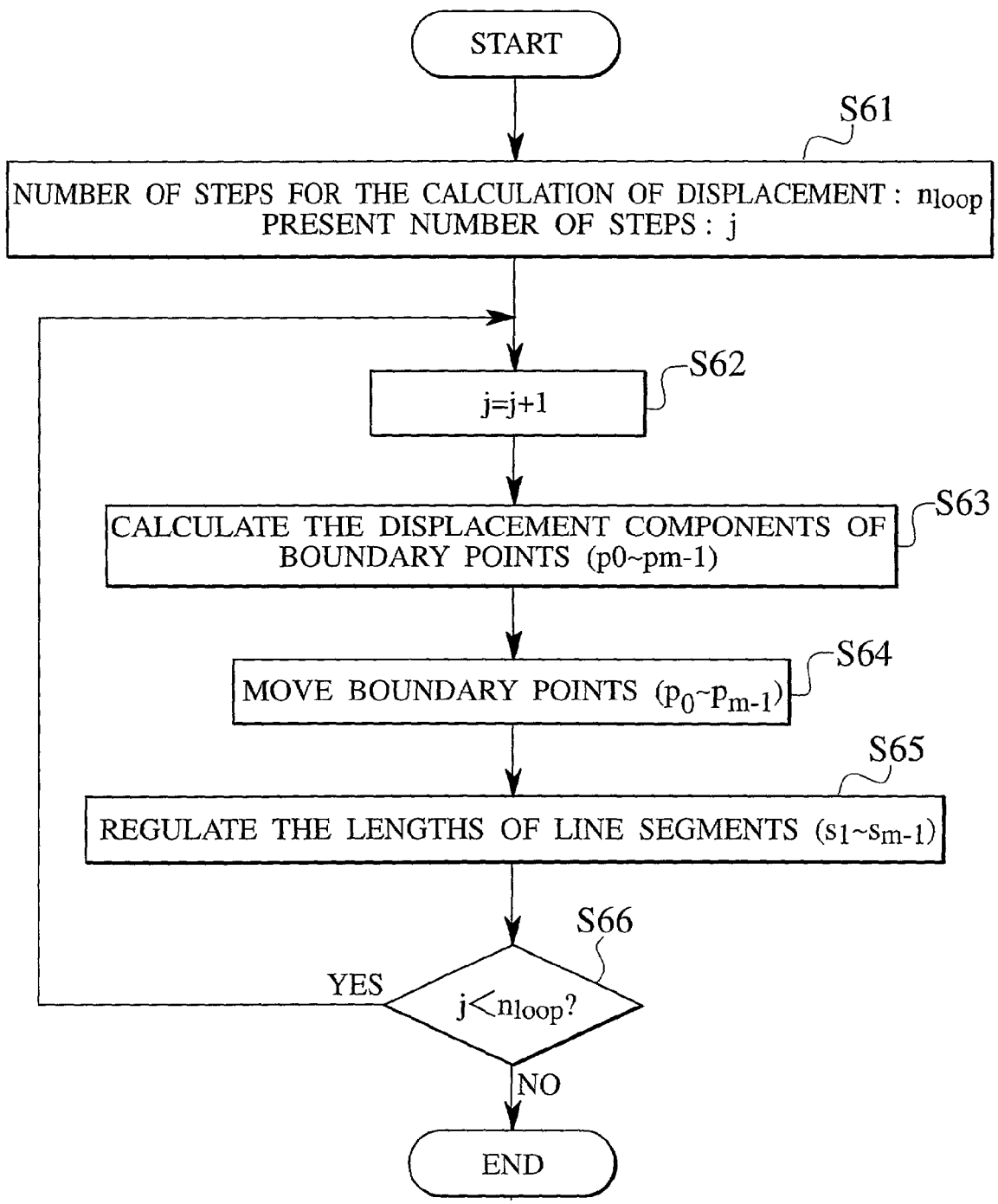

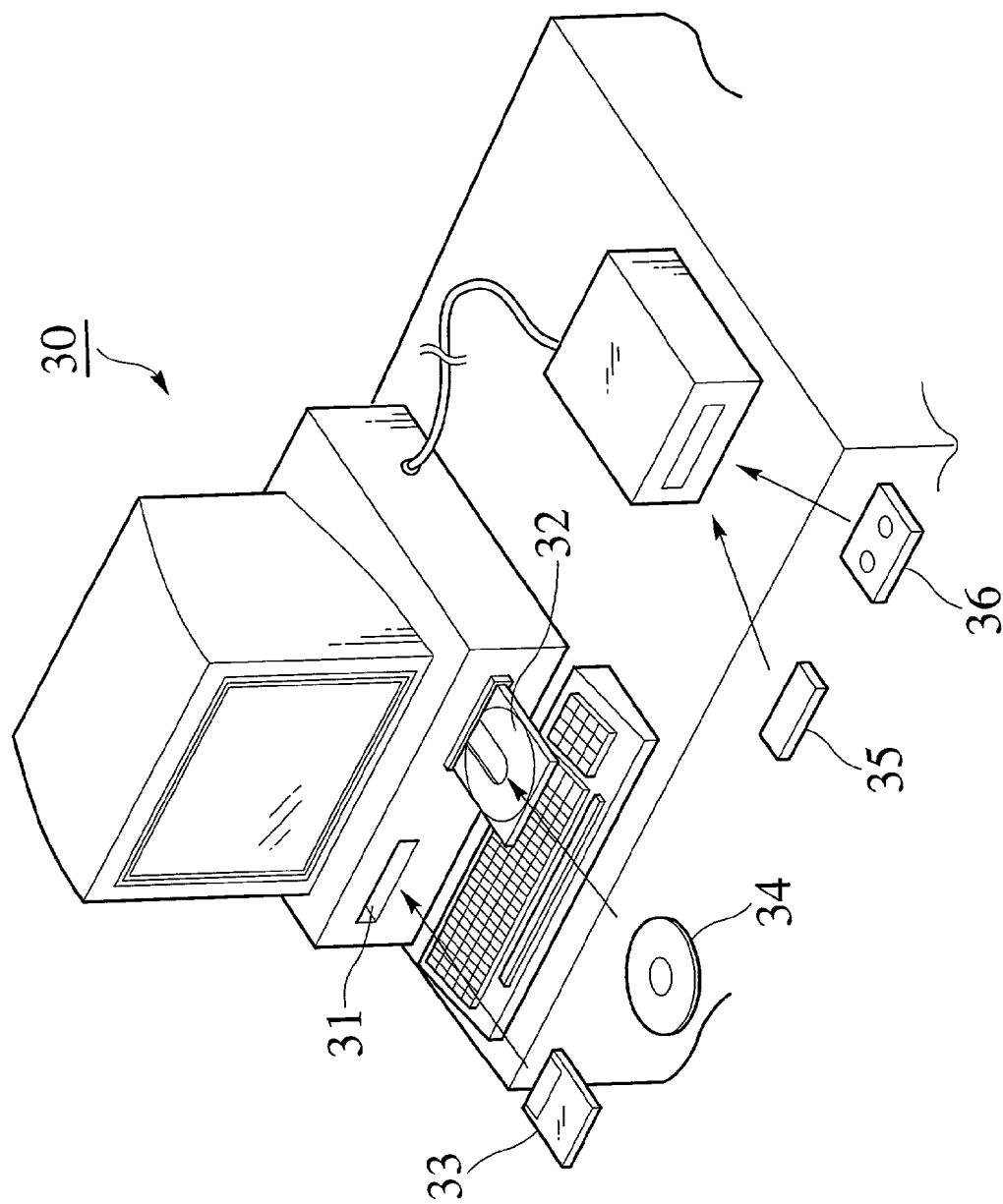

FIG. 17

| NUMBER | BOUNDARY POINT (P) | | | | | LENGTH OF A LINE SEGMENT (S) | | |
|---|---|---|---|---|---|---|---|---|
| | POSITION COORDINATES | | POSITION COORDINATES DISPLACEMENT (U) | | BEFORE MOVEMENT (l) | BEFORE THE REGULATION OF THE LENGTH AFTER MOVEMENT(r) | AFTER THE REGULATION OF THE LENGTH (l) |
| | x | y | Ux | Uy | | | |
| 0 | $x_0$ | $y_0$ | 0 | 0 | | | |
| 1 | $x_1$ | $y_1$ | 0 | 0 | $l_1$ | | |
| 2 | $x_2$ | $y_2$ | 0 | 0 | $l_2$ | | |
| 3 | $x_3$ | $y_3$ | 0 | 0 | $l_3$ | | |
| 4 | $x_4$ | $y_4$ | 0 | 0 | $l_4$ | | |
| 5 | $x_5$ | $y_5$ | 0 | 0 | $l_5$ | | |
| 6 | $x_6$ | $y_6$ | 0 | 0 | $l_6$ | | |

| NUMBER | BOUNDARY POINT (P) | | | | LENGTH OF A LINE SEGMENT (S) | | |
|---|---|---|---|---|---|---|---|
| | POSITION COORDINATES | | POSITION COORDINATES DISPLACEMENT (U) | | BEFORE MOVEMENT (l) | BEFORE THE REGULATION OF THE LENGTH AFTER MOVEMENT(r) | AFTER THE REGULATION OF THE LENGTH (l) |
| | x | y | $U_x$ | $U_y$ | | | |
| 0 | $x_0$ | $y_0$ | $U_{x0}$ | $U_{y0}$ | | | |
| 1 | $x_1$ | $y_1$ | $U_{x1}$ | $U_{y1}$ | $l_1$ | | |
| 2 | $x_2$ | $y_2$ | $U_{x2}$ | $U_{y2}$ | $l_2$ | | |
| 3 | $x_3$ | $y_3$ | $U_{x3}$ | $U_{y3}$ | $l_3$ | | |
| 4 | $x_4$ | $y_4$ | $U_{x4}$ | $U_{y4}$ | $l_4$ | | |
| 5 | $x_5$ | $y_5$ | $U_{x5}$ | $U_{y5}$ | $l_5$ | | |
| 6 | $x_6$ | $y_6$ | $U_{x6}$ | $U_{y6}$ | $l_6$ | | |
| 41 | 42 | | 43 | | 44 | 45 | 46 |

FIG. 19

| NUMBER | BOUNDARY POINT (P) | | | | | LENGTH OF A LINE SEGMENT (S) | | AFTER THE REGULATION OF THE LENGTH (l) |
|---|---|---|---|---|---|---|---|---|
| | POSITION COORDINATES | | POSITION COORDINATES DISPLACEMENT (U) | | BEFORE MOVEMENT (l) | BEFORE THE REGULATION OF THE LENGTH AFTER MOVEMENT(r) | |
| | x | y | Ux | Uy | | | |
| 0 | $x'_0$ | $y'_0$ | 0 | 0 | | | |
| 1 | $x'_1$ | $y'_1$ | 0 | 0 | $l_1$ | $r_1$ | |
| 2 | $x'_2$ | $y'_2$ | 0 | 0 | $l_2$ | $r_2$ | |
| 3 | $x'_3$ | $y'_3$ | 0 | 0 | $l_3$ | $r_3$ | |
| 4 | $x'_4$ | $y'_4$ | 0 | 0 | $l_4$ | $r_4$ | |
| 5 | $x'_5$ | $y'_5$ | 0 | 0 | $l_5$ | $r_5$ | |
| 6 | $x'_6$ | $y'_6$ | 0 | 0 | $l_6$ | $r_6$ | |

41: NUMBER
42: POSITION COORDINATES
43: POSITION COORDINATES DISPLACEMENT (U)
44: BEFORE MOVEMENT (l)
45: BEFORE THE REGULATION OF THE LENGTH AFTER MOVEMENT (r)
46: AFTER THE REGULATION OF THE LENGTH (l)

FIG. 20

| NUMBER | BOUNDARY POINT (P) | | | | BEFORE MOVEMENT (l) | LENGTH OF A LINE SEGMENT (s) | |
|---|---|---|---|---|---|---|---|
| | POSITION COORDINATES | | POSITION COORDINATES DISPLACEMENT (U) | | | BEFORE THE REGULATION OF THE LENGTH AFTER MOVEMENT(r) | AFTER THE REGULATION OF THE LENGTH (l) |
| | x | y | Ux | Uy | | | |
| 0 | x'$_0$ | y'$_0$ | 0 | 0 | | | |
| 1 | x'$_1$ | y'$_1$ | 0 | 0 | $l_1$ | $r_1$ | $r_1$ |
| 2 | x'$_2$ | y'$_2$ | 0 | 0 | $l_2$ | $r_2$ | $r_2$ |
| 3 | x'$_7$ | y'$_7$ | 0 | 0 | $l_3$ | $r_3$ | $l'_3$ |
| 4 | x'$_3$ | y'$_3$ | 0 | 0 | $l_4$ | $r_4$ | $l'_4$ |
| 5 | x'$_8$ | y'$_8$ | 0 | 0 | $l_5$ | $r_5$ | $l'_5$ |
| 6 | x'$_4$ | y'$_4$ | 0 | 0 | $l_6$ | $r_6$ | $l'_6$ |
| 7 | x'$_5$ | y'$_5$ | 0 | 0 | | | $r_5$ |
| 8 | x'$_6$ | y'$_6$ | 0 | 0 | | | $r_6$ |

41, 42, 43, 44, 45, 46

US 6,980,942 B2

1

METHOD OF SIMULATION OF PRODUCTION PROCESS OF SEMICONDUCTOR DEVICE AND SIMULATOR THEREOF

CROSS REFERRENCE TO RELATED APPLICATIONS

The subject application is related to subject matter disclosed in the Japanese Patent Application 2000-085268 filed in Mar. 24, 2000 in Japan, to which the subject application claims priority under the Paris Convention and which is incorporation by reference herein.

BACKGROUND OF THE INVENTION

1. Field of the Invention

The present invention relates to technologies for the simulation of a semiconductor process including oxidation and film formation, and particularly, to a method of the simulation of a topography for a geometrical change of a material region, a simulator for realizing the simulation method and a program for accomplishing the simulation method.

2. Description of the Related Art

In a topography simulation for calculating the topography of a semiconductor device in an oxidation, deposition and etching step or the like, a string model showing the topography of a semiconductor device as shown in FIG. 1A is usually used. In the string model, the topography of a semiconductor is shown by a string of a line segment $S_i$ connecting a boundary point $P_i$ and a boundary point $P_{i+1}$ and each boundary point P is moved in conformity with each process model at each small time interval to calculate the hourly variation in device topography.

Also, as shown in FIG. 1B, a mesh provided with plurally divided triangle elements $E_i$ is disposed in the region enclosed by a string to calculate oxidation and impurity profiles. The boundary point $P_i$ and a point $N_{i+1}$ within the region are called a node N. In the case where the mesh exists in the region, all nodes N including not only the boundary point but also points within the region are moved at each small time interval to calculate the hourly variation in the topography of a semiconductor device. A topography simulation method using such a string model is disclosed in, for example, "VLSI TECHNOLOGY, S.M. Sze, McGraw-Hill, (1988)". However, the prior technologies have the problems shown below.

FIG. 2 shows a flowchart of a conventional method for controlling the length of a line segment s. First, in a step S61, the number $n_{loop}$ of steps as to what times the calculation of the displacement is looped is set to a required number and the present number j of steps is set to zero. Next, in a step S62, 1 is added to the present number j of steps. In a step S63, the component of all boundary points P as to the displacement is calculated, and in a step S64, all boundary points P are moved. In a step S65, the length of at least one or more line segments s constituting a string is regulated. The aforementioned steps S61–S65 are repeated until the present number j of steps is equal to $n_{loop}$.

FIG. 3 is a flow chart showing an internal flow of adding boundary point P to regulate the length of the line segment s in the step S65 of FIG. 2. First, in a step S71, the length of the line segment s after all boundary points P are moved. Next, in a step S72, the identification number i of the line segment s is set to 1. In a step S73, whether or not the length $r_1$ of the line segment $s_1$ after the boundary point P is moved

2 is greater than a maximum length $l_{max}$ to be specified is judged. If $r_1 \geq l_{max}$, a new boundary point P is added to the line segment $s_1$ in a step S74. In a step S75, 1 is added to the number i. In a step S76, whether or not the number i is smaller than the number obtained by adding 1 to a maximum identification number (m-1) is judged. If it is judged to be smaller, the flow is returned to the step S73 and these steps S73–S75 are repeated until the identification number i is equal to m. If the identification number i is equal to m, the process is finished. Namely, all line segments s were judged in order of the number i as to whether or not the length r is greater than the maximum length $l_{max}$. If the length r of the line segment s is larger than the maximum length $l_{max}$, a new boundary point P is added to the line segment s.

FIG. 4 is a flow chart showing an internal flow to eliminate a boundary point P to thereby regulate the length of the line segment s in the step S65 of FIG. 2. First, in a step S81, the length of all line segments s after the boundary point P is moved is calculated. Next, in a step S82, the identification number i of the line segment s is set to 1. In a step S83, whether or not the rength $r_1$ of the line segment $s_1$ after the boundary point P is moved is smaller than a minimum length $l_{min}$ to be specified is judged. If $r_1 \leq l_{min}$, in a step S84, one of the boundary points P constituting the line segment s is eliminated and a new line segment $s'_1$ is produced. In a step S85 and a step S86, when the eliminated boundary P is a connecting point between the line segments $s_1$, and $s_2$, $s_2$ is designated as $s'_1$. These steps are repeated until the identification number i is equal to m-1.

However, if the length r of the line segment s is set to the maximum length $l_{max}$ to be specified or more, a new boundary point is always added to the line segment, giving rise to the problem that useless boundary points are increased. For example, when a groove 59 is formed on a silicon substrate 52 as shown in FIG. 5A, a silicon oxide film 61 is formed on the surface of the silicon substrate 52 by deposition as shown in FIG. 5B. The result of topography simulation as to a region 60 is shown FIG. 6. As shown in FIG. 6, the surface string of the substrate 52 is constituted of line segments arranged at unequal intervals. Each topography between boundary points P0 and P1 and between boundary points P15 and P16 is considered to be able to be estimated from each displacement between the boundary points P0 and P1 and between the boundary points P15 and P16 respectively and no node is arranged between the boundary points P0 and P1 and between the boundary points P15 and P16, whereby it is expected to shorten calculation time. However, because the value of the specified maximum length $l_{max}$ is short, there is the case where needless boundary points 62 and 64 are prepared and therefore the calculation time cannot be shortened as is expected.

On the other hand, it is effective to dispose a new node 63 on lengthened line segments s13 and s14 having lengths of r13 and r14 respectively to raise the accuracy of topography simulation. However, because the specified maximum length $l_{max}$ may be larger, the node 63 is formed on the line segment s14 but no node is produced on the line segment s13 and therefore the accuracy of the topography cannot be raised.

In this manner, the value of an absolute maximum length $l_{max}$ which shortens time and improves accuracy does not exist, causing such an inconvenience that customers must design an optimum value of each of the maximum length $l_{max}$ and minimum length $l_{min}$ of the line segment s from the structure of a semiconductor which must be analyzed by the customers. Specifically, the conventional topography processing methods involve the case where exact topography of a device cannot be expressed and the case where calculation is made in vain. Therefore, it cannot be said that these method are practical to develop semiconductor devices.

SUMMARY OF THE INVENTION

The present invention has been conducted in view of the above situation and it is an object of the present invention to provide a two-dimensional or three-dimensional process simulation method which can shorten calculation time and improve the accuracy of calculation even in a fine region resulting from, for example, the progress of thin film-formation and a process simulator which attains this simulation method.

Another object of the present invention is to provide a program which attains a two-dimensional or three-dimensional process simulation method which can shorten calculation time and improve the accuracy of calculation even in a fine region resulting from, for example, the progress of thin film-formation and a recording medium in which this program is recorded.

To attain the above object, according to a first aspect of the present invention, there is provided a simulation method comprising a first step of generating plural boundary points on a string formed on the surface of a material, a second step of obtaining a first length of a line segment between the boundary points, a third step of calculating the displacement of the boundary point according to a process model, a fourth step of moving the boundary point by the displacement, a fifth step of obtaining a second length of the line segment between the boundary points after the boundary point is moved and a sixth step of making reference to the first and second lengths to add or eliminate boundary points. In this structure, the line segment after the boundary point is moved is regulated by making reference to the length of the stored line segment. Therefore, it is not required for users to design a maximum length and a minimum length to regulate the line segment. Further, such a problem that useless boundary points are increased can be avoided. This ensures that calculation time is more shortened than in a conventional method and a two-dimensional and three-dimensional topography simulation can be accomplished with high calculation accuracy.

According to a second aspect of the present invention, there is provided a simulator comprising a node displacement-calculating section for calculating the displacement of the boundary point in accordance with a process model, a node moving section for moving the boundary point by the displacement, a length-calculating section for obtaining the length of the line segment between the boundary points before and after the boundary point is moved and a regulating section for making reference to the lengths before and after the boundary point is moved to add or eliminate the boundary point. According to this structure, the line segment after the boundary point is moved is regulated by making reference to the length of the stored line segment. Therefore, it is not required for users to design a maximum length and a minimum length to regulate the line segment. Further, such a problem that useless boundary points are increased can be avoided. This ensures that calculation time is more shortened than in a conventional method and a two-dimensional and three-dimensional topography simulation can be accomplished with high calculation accuracy.

According to a third aspect of the present invention, there is provided a program which is executed by a computer, the program comprising a first step of obtaining a first length of a line segment between the boundary points generated on the surface of a material, a second step of calculating the displacement of the boundary point according to a process model, a third step of moving the boundary point by the displacement, a fourth step of obtaining a second length of the line segment between the boundary points after the boundary is moved and a fifth step of making reference to the first and second lengths to add or eliminate boundary points. In this structure, the line segment after the boundary point is moved is regulated by making reference to the length of the stored line segment. Therefore, it is not required for users to design a maximum length and a minimum length to regulate the line segment. Further, such a problem that useless boundary points are increased can be avoided. This ensures that calculation time is more shortened than in a conventional method and a two-dimensional and three-dimensional topography simulation can be accomplished with high calculation accuracy.

Other and further objects and features of the present invention will become obvious upon an understanding of the illustrative embodiments about to be described in connection with the accompanying drawing or will be indicated in the appended claims, and various advantages not referred to herein will occur to one skilled in the art upon employing of the invention in practice.

BRIEF DESCRIPTION OF THE DRAWINGS

FIG. 2 to FIG. 4 are flowcharts of a conventional simulation method for topography processing.

FIG. 14 is an outward view showing the relation between a recording medium and a computer according to an embodiment of the present invention.

FIG. 17 to FIG. 20 are views showing changes in a data structure for explaining a simulation method for a silicon nitride film in the simulation example 1.

DETAILED DESCRIPTION OF THE EMBODIMENTS

Figure 1A:
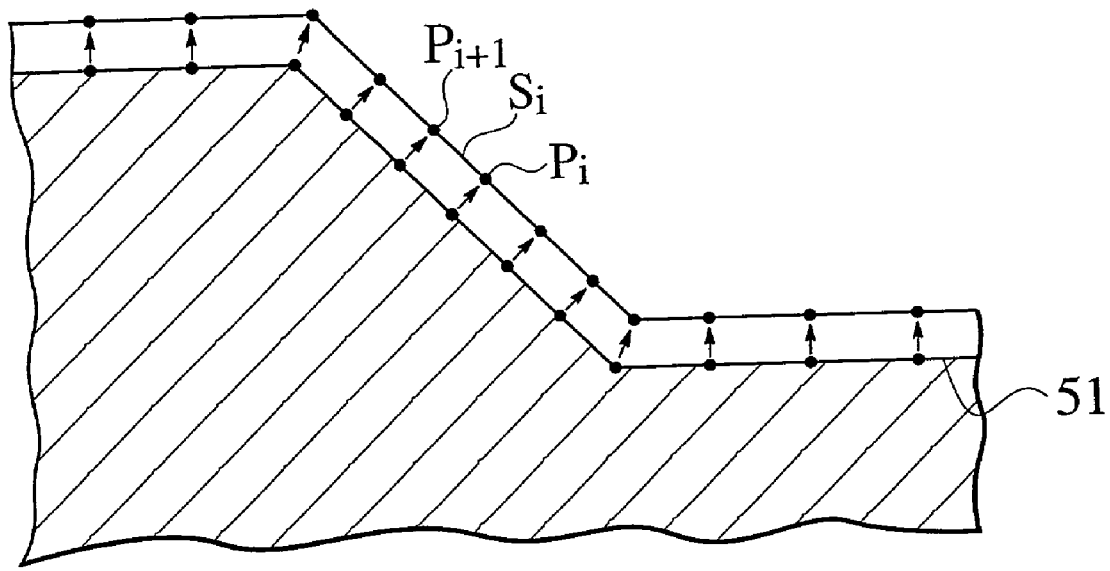
FIG. 1A and FIG. 1B are views for explaining the terms used in a simulation method.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Explanations will be furnished on the assumption that the analytic zone is two-dimensional and the displacement components are $u_x$ (a displacement in the x direction) and $u_y$ (a displacement in the y direction) for the sake of convenient explanations.

Figure 7:
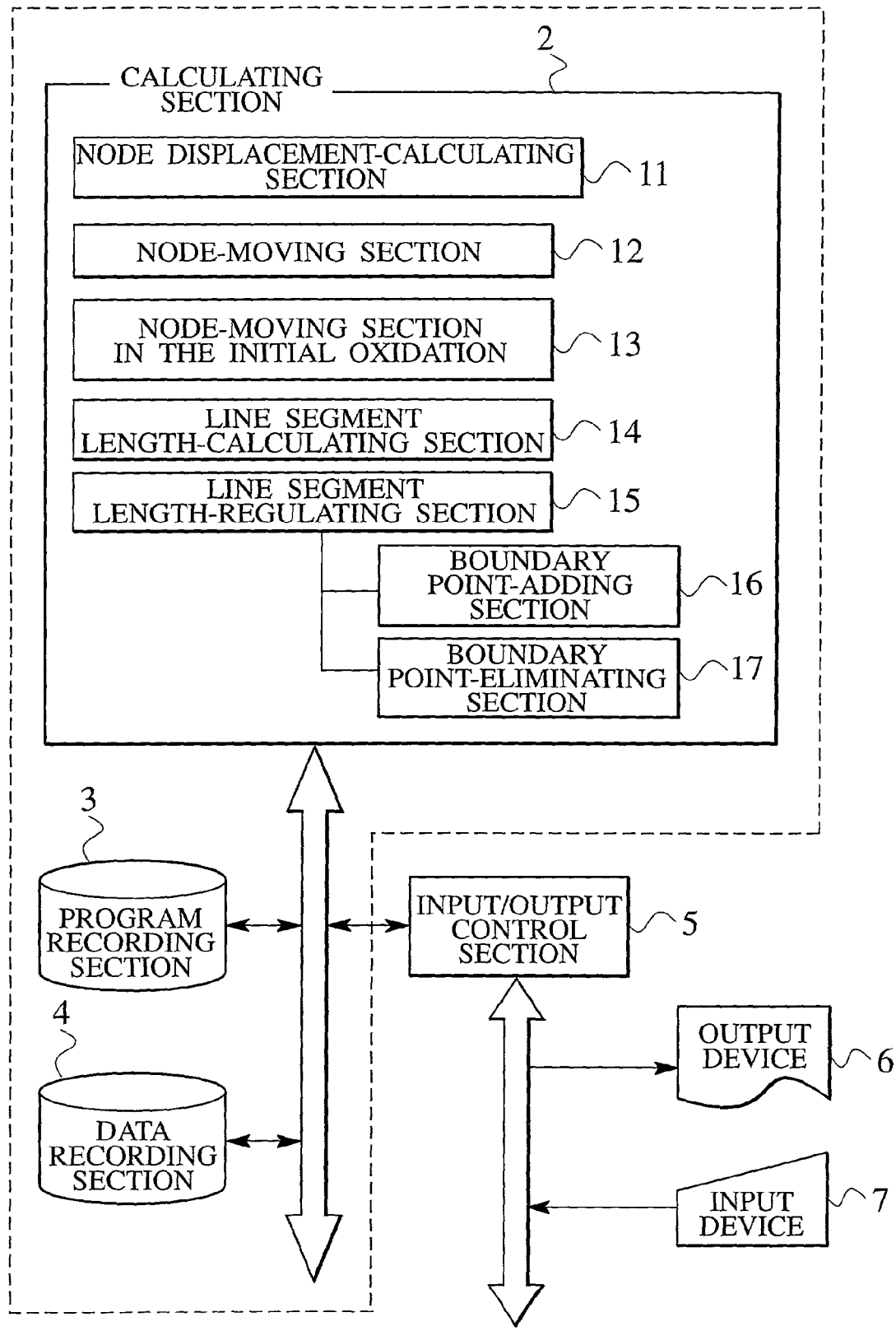
FIG. 7 is a schematic structural view of a simulator according to an embodiment of the present invention.

FIG. 7 is a schematic structural view of a simulator according to the present invention. A simulator 1 according to the present invention comprises a calculating section 2, a program recording section 3 in which a program to be executed in the calculating section 2 is recorded, a data recording section 4 which records, for example, data to be used for the calculation of all nodes and line segments and an input/output control section 5 which exchanges data with an output device 6 and an input device 7. The calculating section 2 comprises a node displacement-calculating section 11 which calculates the displacement of every node, a node-moving section 12 which moves a node based on the displacement of every node, a node-moving section 13 which sets a node in the initial oxidation stage, a calculating section 14 which calculates the length of a line segment between nodes and a regulating section 15 which adds or eliminates a boundary point on the basis of the calculated length of a line segment to regulate the length. Further, the line segment length-regulating section 15 comprises a boundary point-addition section 16 and a boundary point-elimination section 17. The details will be explained with reference to a flowchart of the following embodiment.

(With Regard to a Method of Moving a Node)

A topography processing method in the case of applying the node-moving method to a simulation of a thermal oxidation step will be explained. In the node-moving method, only the node displacement-calculating section 11 and the node-moving section 12 are used in the calculating section 2 shown in FIG. 7.

Figure 8:
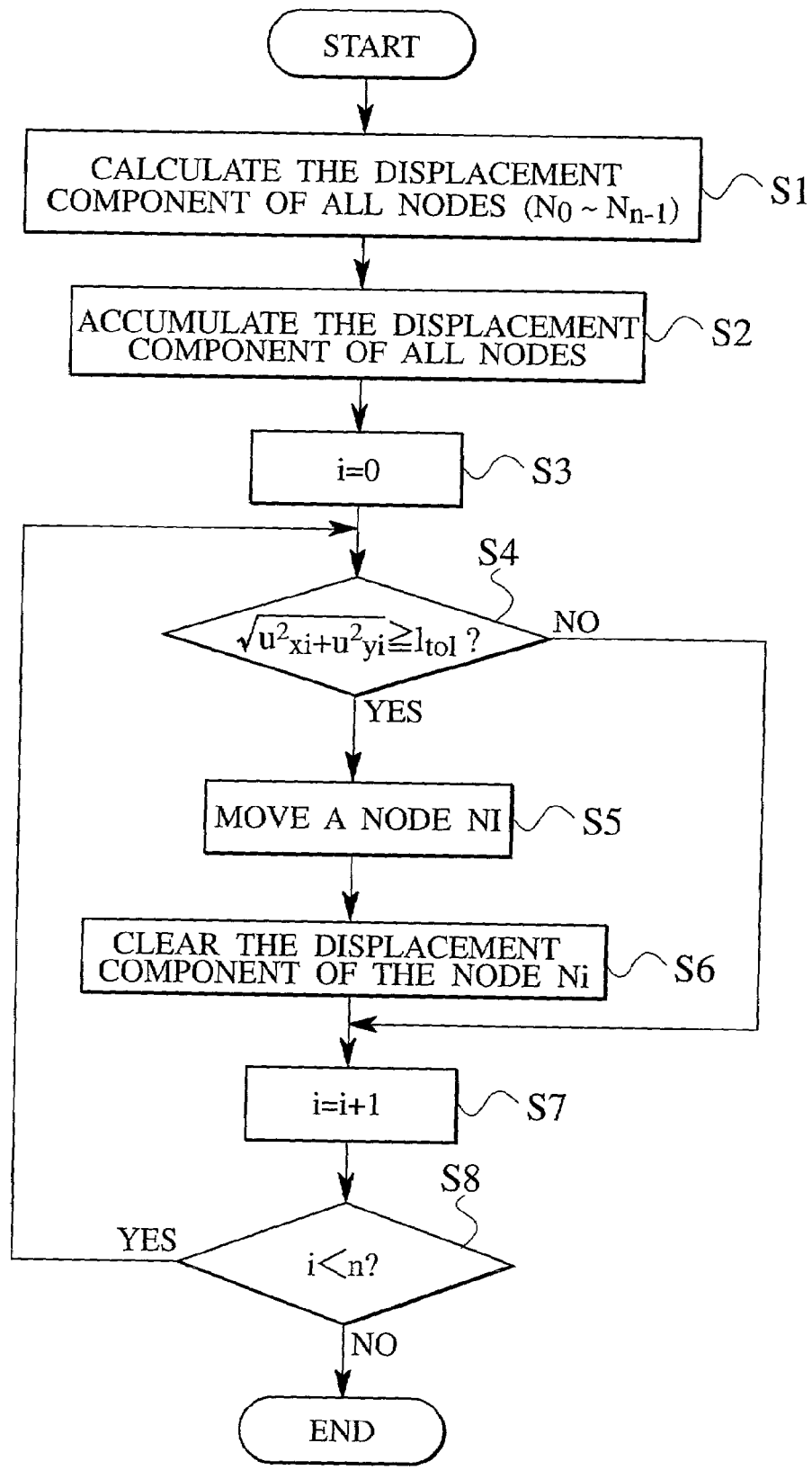
FIG. 8 is a flowchart of a node-moving method in a simulation method according to the present invention.

FIG. 8 shows a flowchart of the node-moving method according to the present invention.

First, in step S1, the displacements of all nodes $N_0$ to $N_{n-1}$ in a region of a material are calculated every each of the components $u_x$ and $u_y$ in the node displacement-calculating section 11. The following steps S2 to S8 are carried out in the node-moving section 12. In the step S2, the displacement components calculated in the step S1 are added every component to the displacement components stored until the last time. The initial value of each displacement component is set to 0(zero). In the step S3, the identification number i of a node is set to 0(zero). In the step S4, whether the displacement $\{\sqrt{(u^2_{x0}+u^2_{y0})}\}$ of a node $N_0$ is more than a displacement tolerance ($l_{tol}$) or not is judged. If the displacement of the node $N_0$ is more than the displacement tolerance, the node $N_0$ is moved in the step S5, specifically, the displacement components are added every each of the position coordinates of the node $N_0$. Then, in the step S6, the displacement components ($u_{x0}$, $u_{y0}$) are cleared and set to 0(zero). If the displacement of the node $N_0$ is less than the displacement tolerance, the displacement component is stored without moving the node $N_0$. In the step S7, 1 is added to the identification number i to set the identification number newly to 1. In the step S8, whether or not the identification number 1 is smaller than a number n obtained by adding 1 to the maximum value n−1 of the identification number is judged. If smaller, the step S4 is carried out again. Then, this loop is repeated until the identification number i is n−1. When the identification number i is n in the step S7, the judgment made in the step S8 is "NO" and the flowchart of the node-moving method is finished. This method ensures that the accumulation of errors caused by the displacements less than the displacement tolerance can be eliminated thereby reducing errors in actual topography movement.

(Simulation Example By a Node-Moving Method)

Figure 9A:
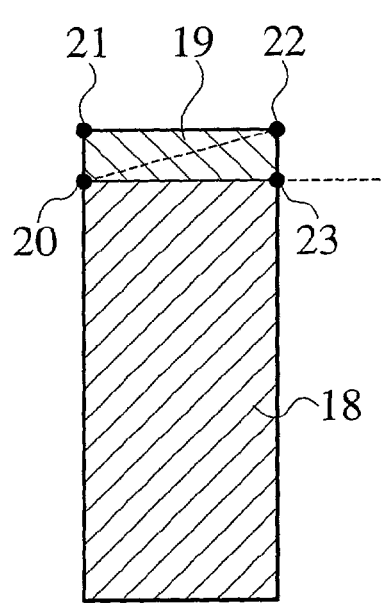
FIG. 9A to FIG. 9C are sectional views of a silicon substrate for explaining a simulation method for the topography of a thermal oxide film when a silicon substrate is thermally oxidized using a node-moving method in a simulation method according to the present invention.

A topography processing method in the case of applying the node-moving method to a simulation of a thermal oxidation step. In the simulation example, as shown in FIG. 9A, a thermal oxide film 19 is formed in advance on a silicon substrate 18 having a flat structure. The substrate 18 is thermally oxidized further. Nodes 20, 21, 22 and 23 are arranged only at boundary points constituting the oxide film region 19 for the sake of convenient explanations.

Figure 9B:
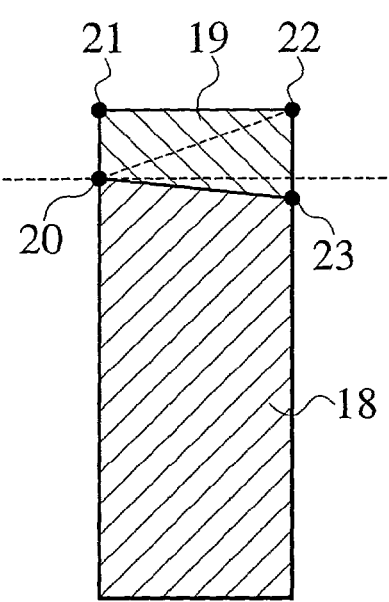

First, in the step S1 of FIG. 8, the displacements of all nodes 20, 21, 22 and 23 in the oxide film region 19 are calculated every each of the components $u_x$ and $u_y$. In the step S2, the displacement components calculated in the step S1 are added every component to the displacement components initialized to 0. In the step S3, the identification number i of a node is set to 0. In the step S4, whether the displacement $\{\sqrt{(u^2_{x0}+u^2_{y0})}\}$ of a node $N_0$ (assumed as the node 20) is more than a displacement tolerance ($l_{tol}$) or not is judged. The displacement tolerance is, for example, 0.05 nm. If the displacement of the node 20 is slightly smaller than 0.05 nm due to a numerical calculation error, it is less than the displacement tolerance. For this, as shown in FIG. 9B, the node 20 is not moved and the displacement components are stored. In the step S7, 1 is added to the identification number i to set the identification number newly to 1. In the step S8, whether or not the identification number 1 is smaller than a numeral 4 obtained by adding 1 to the maximum value 3 of the identification number is judged. Since the judgment is true, the step S4 is carried out again.

In the step S4, whether the displacement of a node $N_1$ (assumed as the node 21) is more than a displacement tolerance ($l_{tol}$) or not is judged. Since the displacement of the node 21 is more than the displacement tolerance, the node N21 is moved in a step S5 as shown in FIG. 9B. Actually, the displacement component is added every component of the position coordinates of the node N21. Then, in a step S6, the displacement component is cleared and set to 0. In a step S7, 1 is added to the identification number i to set the identification number newly to 2. In a step 8, whether the identification number 2 is smaller than 4 or not is judged. Since 2 is smaller than 4, the step S4 is carried out again. The node 22 which is a node $N_2$ and the node 23 which is a node $N_3$ are processed by the same loop as in the case of the node 21. The displacement of the node 23 is slightly larger than 0.05 nm due to a numerical calculation error and the node 23 is moved downward slightly longer than 0.05 nm from a standard plane 24. Finally, in the step S7, when the identification number i is 4, the judgment made in the step S8 is "NO" in the step S8 and the flowchart of the node-moving method is finished. As a result, the interface between the silicon substrate 18 and the oxide film 19 is not made to be flat.

Figure 9C:
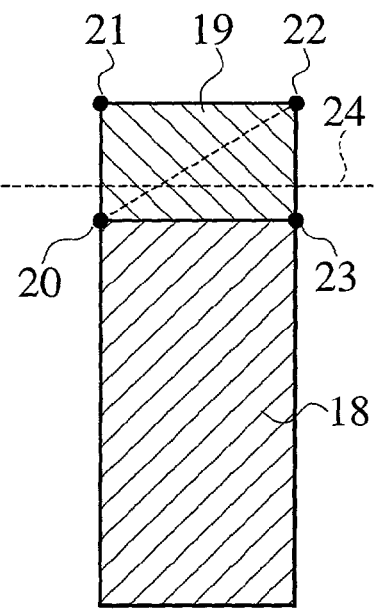

Next, a process according to the flowchart of FIG. 8 is performed again using the resulting topography of FIG. 9B as a starting topography. First, the displacements of all nodes 20, 21, 22 and 23 are calculated in the step S1. In the step S2, the displacements components calculated in the step S1 are added to the displacement components which are stored or cleared in the last flow. In the step S3, the identification number i of the node is set to 0. In the step S4, whether the displacement of the node $N_0$ (node 20) is greater than the displacement tolerance ($l_{tol}$) or not is judged. The displacement of the node 20 is a value of about 0.1 nm which is the sum of a value slightly smaller than 0.05 nm and a value of the same level. Since the displacement of the node 20 is more than the displacement tolerance, the node 20 is moved in the step S5 as shown in FIG. 9C. Then, in the step S6, the displacement components are cleared. In the step S7, 1 is added to the identification number i to set the identification number newly to 2. In the step S8, whether the identification number 2 is smaller than 4 or not is judged. Since the judgment is true, the step S4 is carried out again.

In the step S4, whether the displacement of a node $N_1$ (assumed as the node 21) is more than the displacement tolerance ($l_{tol}$) or not is judged. Since the displacement of the node 21 is more than the displacement tolerance, the node 21 is moved in a step S5 as shown in FIG. 9C. In the step S6, the displacement component is cleared. In the step S7, 1 is added to the identification number i to set the identification number newly to 2. In the step 8, whether the identification number 2 is smaller than 4 or not is judged. Since the judgment is true, the step S4 is carried out again. The node 22 which is the node $N_2$ and the node 23 which is the node $N_3$ are processed by the same loop as in the case of the node 21. The displacement of the node 23 is slightly larger than 0.05 nm. The node 23 is moved downward slightly longer than 0.05 nm and disposed at a position slightly longer than 0.1 nm downward from the standard plane 24. Finally, in the step S7, when the identification number i is 4, the judgment made in the step S8 is "NO" and the flowchart of the node-moving method is finished. As a result, the interface between the silicon substrate 18 and the oxide film 19 is made flat.

Specifically, the displacement components of the node 20 are stored. Therefore, when the substrate is oxidized in the state shown in FIG. 9B, the displacement components of the node 20 are those obtained by adding the sum of displacement components until the last time, which makes it possible to be freed of the influence of numerical calculation errors as shown in FIG. 9C. Also, according to the present invention, such a problem that the oxide film region 19 cannot be formed even if the time interval is decreased to reduce the numerical calculation errors does not arise.

(Embodiment)

In the embodiment, a topography processing method in the case of applying the method to a simulation in a deposition step will be explained. In the embodiment, besides the node displacement calculating section 11, the node-moving section 12 and the node-removing section 13 in the initial oxidation stage, a line segment length-calculating section 14 and a boundary point addition section 16 and a boundary point elimination section 17 of the line segment length-regulating section 15 are newly used in the calculating section 2 shown in FIG. 7.

In a topography simulation for calculating the topography of a semiconductor device in etching and deposition steps or the like, first the topography of the surface of a two-dimensional section is expressed approximately by a series of plural line segments s. Next, using a node N among these line segments s as a boundary point P, the boundary point P is moved every small time interval in accordance with each process model to calculate the hourly variation of the topography. At this time, as topography processing technologies which become of importance, not only the technologies concerning the aforementioned movement of the node N but also technologies for regulating the length of the line segment s, specifically, technologies for adding and eliminating the node N are required.

Figure 10:
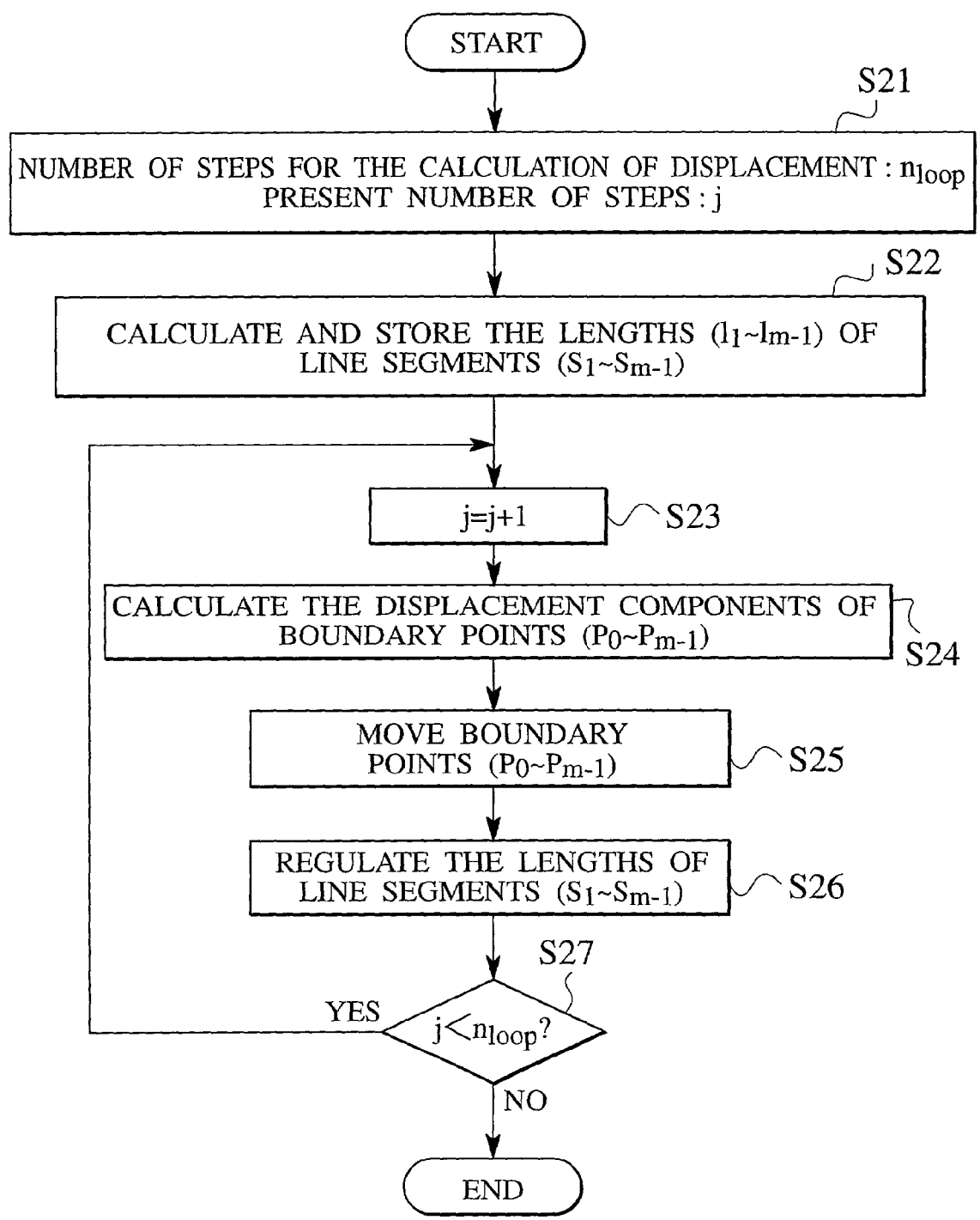
FIG. 10 is a flowchart of a simulation method according to an embodiment of the present invention.

FIG. 10 shows a flowchart of a topography simulation method involving a method of regulating the length of the line segment according to the embodiment of the present invention. First, in a step S21, the number of loops for moving the boundary point P is set as the number $n_{loop}$ of steps and 0 is set as the present number j of steps. Next, in a step S22, the length l of each of one or more line segments s constituting a string is calculated and stored in the line segment length-calculating section 14 of FIG. 7. In a step S23, 1 is added to the present number j of steps to set 1 as the number of steps. In a step S24, the displacement component of the boundary point P is calculated in the same manner as in the step S1 of FIG. 8. In a step S25, the boundary point P is moved in the same manner as in the steps S2 to S8 of FIG. 8. In a step S26, the length of the line segment s is regulated. The above steps are repeated until the number j of steps for the calculation of the displacement is equal to $n_{loop}$.

Figure 11:
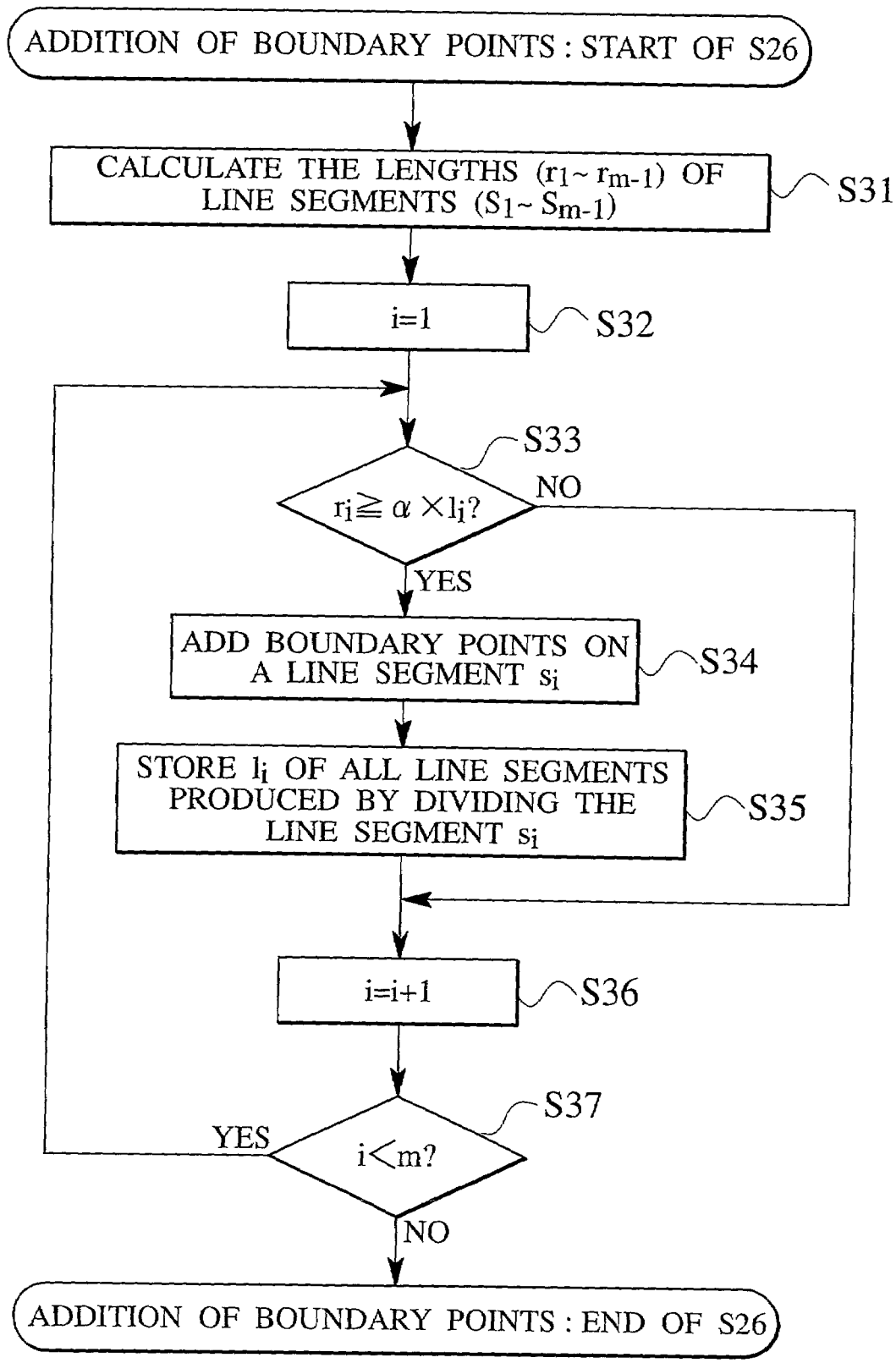
FIG. 11 is a flowchart showing the addition of boundary points, the flow being the internal flow of the step S26 of FIG. 10.

FIG. 11 is a flowchart showing an internal flow for adding the boundary point P to regulate the length r of the line segment s in the step S 26 of FIG. 10. First, in a step S31, the length of the line segment s after the boundary point P is moved is calculated in the line segment length-calculating section 14 shown in FIG. 7. The following steps S32 to S37 are carried out in the boundary point addition section 16 shown in FIG. 7. In the step S32, the identification number i of the line segment s is set to 1. In the step S33, whether or not the length $r_1$ of the line segment $s_1$ after the boundary point P is moved is more than a value $\alpha \times l_1$ obtained by multiplying the stored length $l_1$ before the boundary point is moved by a factor $\alpha$ is judged. If $r_1 \geq \alpha \times l_1$, a new boundary point P is added to the line segment $s_1$ in the step S34. In the step S35, a length l is stored for each of two line segments s produced by dividing the line segment $s_1$. In the step S36, 1 is added to the identification i to set the number i to 2. On the other hand, if $r_1$ is smaller than $\alpha \times l_1$, the step S36 is carried out without carrying out the steps S34 and S35. The process involving the step S33 to the step S36 is repeated until the identification number i of the line segment s is equal to m-1.

Here, the factor $\alpha$ is designed to be larger than 1. This makes it possible to attain such an object as to provide a new boundary point with the intention of shortening the interval between each boundary point P when the interval is spread so that fine topography can be obtained with difficulty. Also, since the line segment s is divided into two line segments by a new boundary point, the factor $\alpha$ is preferably about 2 to retain the same length as that of the original line segment.

On the other hand, if the factor α exceeds 4, the original purpose of obtaining a detail topography cannot be attained. In addition, it is considered that the accuracy of the simulation is more improved as the factor is closer to 1 from 2.

Figure 12:
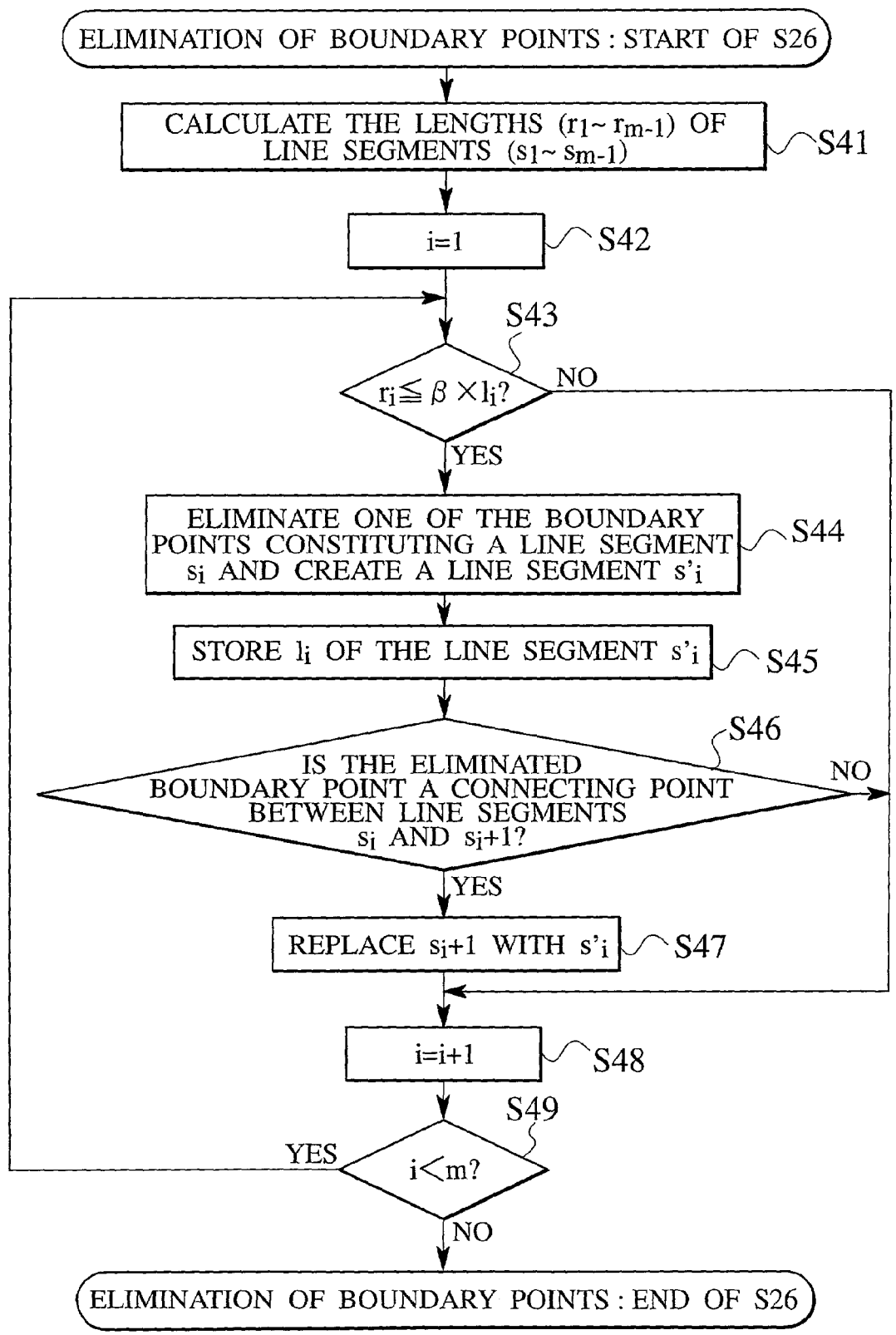
FIG. 12 is a flowchart showing the elimination of boundary points, the flow being the internal flow of the step S26 of FIG. 10.

FIG. 12 is a flowchart showing an internal flow for eliminating the boundary point P to regulate the length r of the line segment s in the step S26 of FIG. 10 similarly to the case of FIG. 11. First, in a step S41, the length r of the line segment s after the boundary point P is moved is calculated in the line segment length-calculating section 14 shown in FIG. 7. The following steps S42 to S49 are carried out in the boundary point eliminating section 17 shown in FIG. 7. In the step S42, the identification number i of the line segment s is set to 1. In the step S43, whether or not the length $r_1$ of the line segment $s_1$ after the boundary point P is moved is less than a value $\beta \times l_1$ obtained by multiplying the stored length $l_1$ before the boundary point is moved by a factor β is judged. If $r_1 \leq \beta \times l_1$, one of the boundary points P constituting the line segment $S_1$ is eliminated and a new line segment $s'_1$ is generated in the step S44. In the step S45, a length $l_1$ of the line segment $s'_1$ is stored. Next, in the steps S46 and S47, if the eliminated boundary point P is a boundary point P common to the line segments $s_1$ and $s_2$, $s_2$ is replaced with $s'_1$. In the step S48, 1 is added to the identification i to set the number i to 2. On the other hand, if $r_1$ is larger than $\beta \times l_1$, the step S48 is carried out without carrying out the steps S44 and S47. Also, if the eliminated boundary point P is not a boundary point P common to the line segments $s_1$ and $s_2$, the step 48 is carried out without carrying out the steps S44 to S47. The process involving the above step S43 to the step S48 is repeated until the identification number i of the line segment s is equal to m−1.

Here, the factor β is designed to be smaller than 1. This makes it possible to narrow the interval between each boundary point P and to attain such an object as to omit calculations more than required to obtain a desired topography. Also, since two line segments s are made into one line segment s, the factor β is preferably about 0.5 to retain the length longer than that of the original line segment. On the other hand, if the factor β is less than 0.25, the original purpose of shortening the calculation time cannot be attained. In addition, it is considered that the calculation time is more shortened as the factor is closer to 1 from 0.5. As the factor is closer to 0.5 on the contrary, the accuracy of the simulation is more improved. It is to be noted that if β is designed to be an inverse of α, the variables can be decreased with the result that the factors are reduced to one in number to attain the optimization of the simulation with ease.

Figure 13:
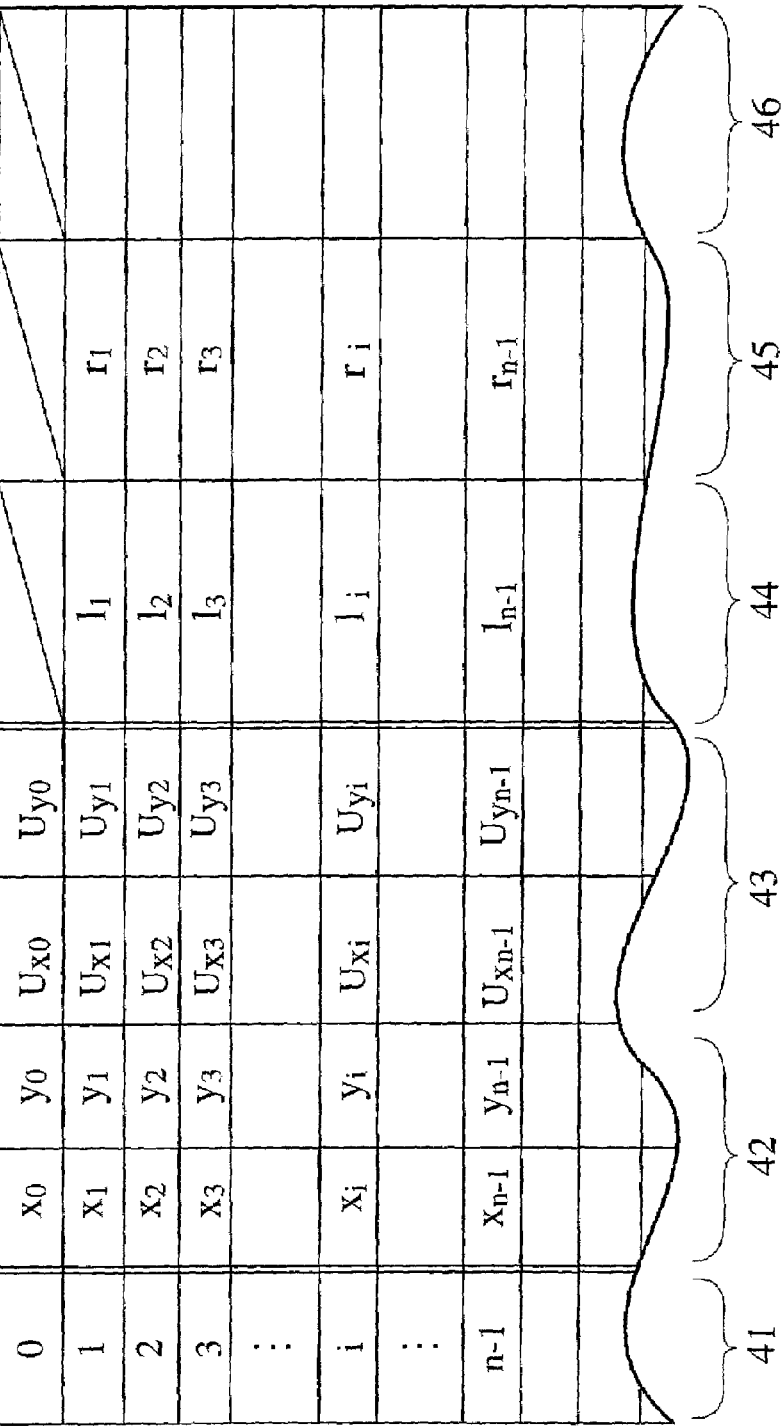
FIG. 13 is a structural view of the data used in a simulation method according to an embodiment of the present invention.

FIG. 13 is a view of a data structure used in a simulation method according to the embodiment of the present invention. The data structure comprises a boundary point identification number data zone 41 to which the identification numbers of all boundary points and line segments can be input, a position coordinate data zone 42 to which the coordinates of a boundary point can be input corresponding to an identification number, a boundary point displacement data zone 43 to which the displacement of a boundary point can be input every coordinate component corresponding to an identification number, a before-move line segment length data zone 44 to which the length of a line segment before a boundary point is moved can be input corresponding to an identification number, an after-move line segment length data zone 45 to which the length of a line segment, after a boundary point is moved and before the length is regulated, according to an identification number and a line segment length data zone 46 to which the length of a line segment after the length is regulated can be input corresponding to an identification number.

The series of processings shown by a flowchart in FIG. 8 and FIG. 10 to FIG. 12 is recorded in a computer-readable recording medium as a program to be executed by a computer. The data structure having data operated by a computer as shown in FIG. 13 is also recorded in the computer-readable recording medium. This program is stored in the program-recording section 3 of FIG. 7 and the data structure is stored in the data recording section 4. Here, the recording medium includes mediums capable of recording a program such as a semiconductor memory, magnetic disk, optical disk and magnetic tape.

FIG. 14 is an outward view showing one example of a computer system which reads a program and the like stored in a recording medium according to the embodiment of the present invention to carry out a topography simulation according to the procedures written therein. A floppy disk drive 31 and a CD-ROM drive 32 are disposed on the front of the body of a computer system 30. A floppy disk 33 or a CD-ROM 34 are inserted from the entrance of each drive and a prescribed read operation is carried out to thereby install programs stored in these recording media in the system. Further, the program can be transferred from other computers through a transmission medium such as internet. Also, for example, a ROM 35 as a semiconductor memory used for a game pack and a cassette tape 36 as a magnetic tape may be used by connecting specified drives.

(Simulation Example 1 of the Embodiment)

Figure 15A:
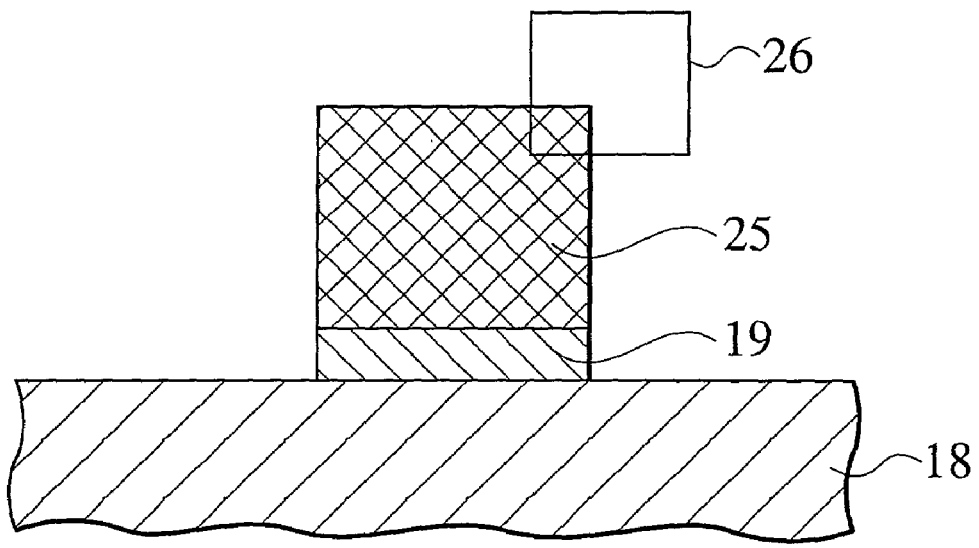
FIG. 15A and FIG. 15B are views for explaining the state of a silicon nitride film (simulation example 1) formed around a gate electrode of a MOSFET to which film a simulation method according to an embodiment of the present invention is applied.
Figure 15B:
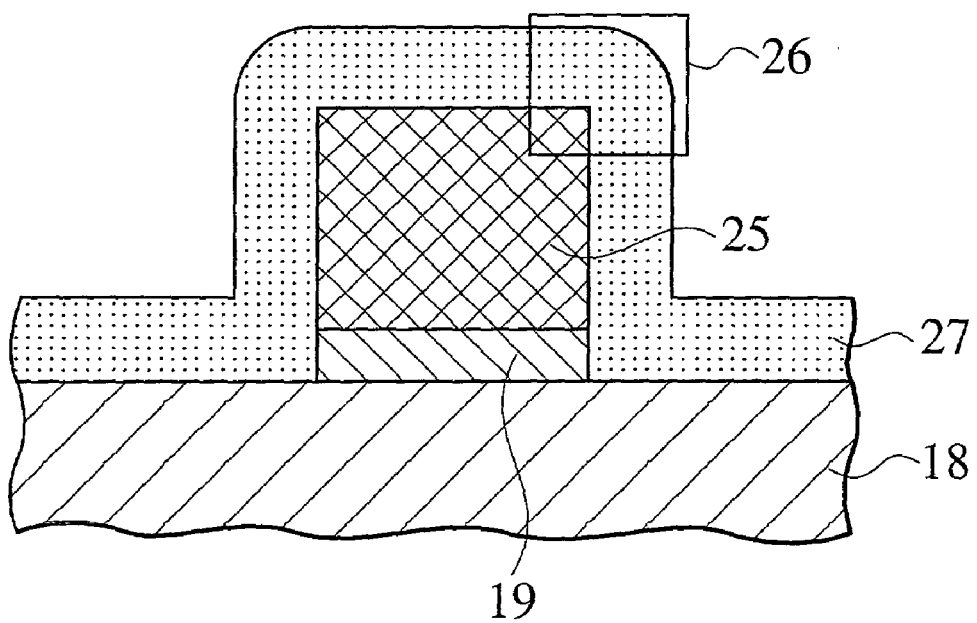

Explanations will be furnished as to a topography processing method in the case of applying the embodiment to a simulation of a step of deposition of a silicon nitride film for forming a side wall of a field effect transistor (MOSFET) having a metal oxide semiconductor structure. In the simulation example, as shown in FIG. 15A, a thermal oxide film 19 to be a gate oxide film is disposed on a flat silicon substrate 18 and a polysilicon 25 to be a gate electrode is disposed on the film 19. A square 26 is a simulation region which is a subject of calculation this time. As shown in FIG. 15B, a silicon nitride film 27 is formed on the exposed surface of each of the substrate 18, film 19 and polysilicon 25 shown in FIG. 15A. This filming step is simulated hereinbelow to obtain the topography of the film 27 to be generated in the region 26.

Flowcharts shown in FIG. 8, FIG. 10 and FIG. 11 are used for the simulation. The chart of FIG. 10 is used as a main routine and the charts of FIG. 8 and FIG. 11 are used as subroutines. First, in a step S21 of FIG. 10, the number $n_{loop}$ of steps for the calculation of a displacement is set to 3 and the present number j of steps is set to 0.

Figure 16:
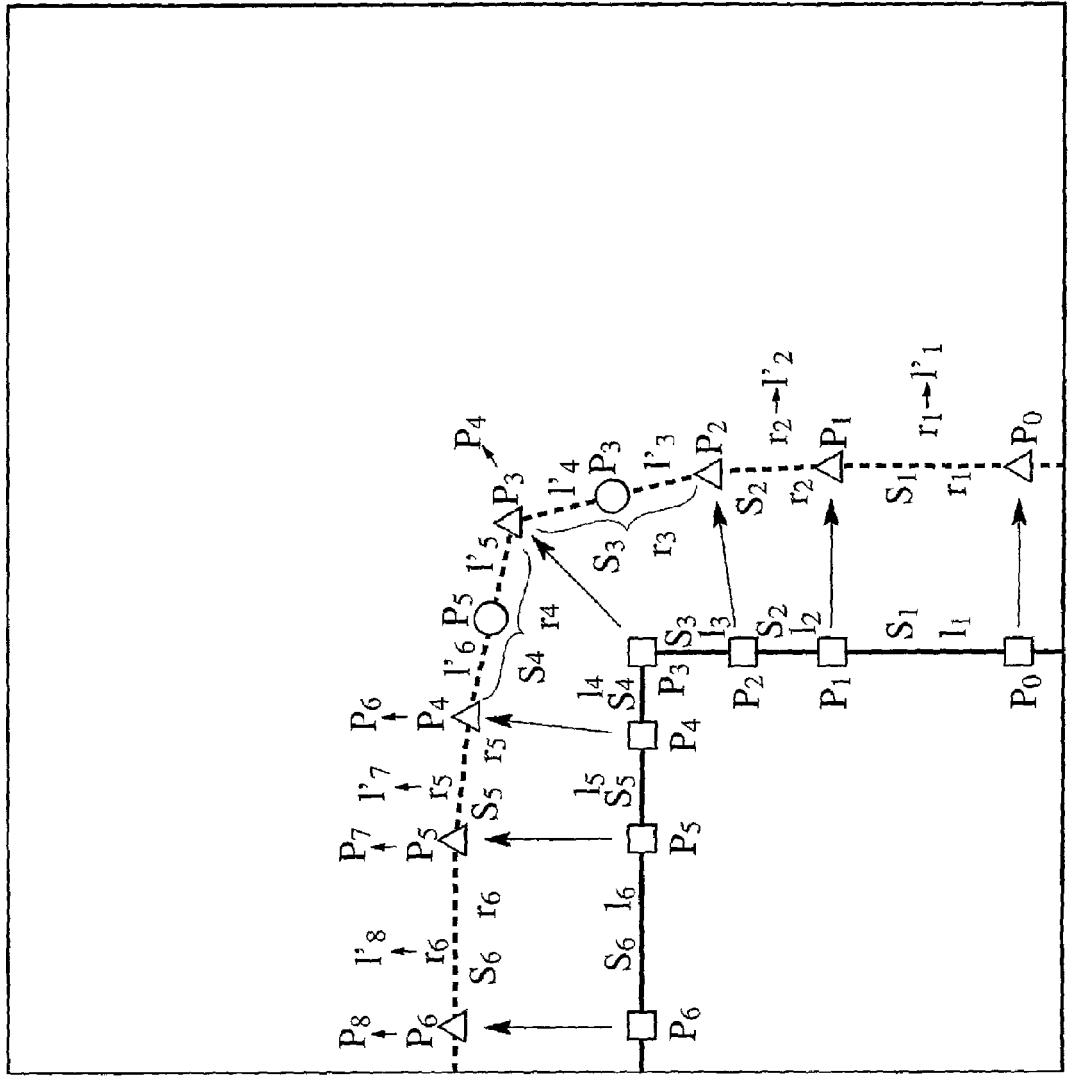
FIG. 16, FIG. 21 and FIG. 22 are views for explaining a simulation method for a silicon nitride film in a simulation example 1.

Next, in FIG. 16, a string which connects the solid line through □ is generated. Here, the string means a plane to be observed for the purpose of a simulation. The position of the solid line is made to accord to the surface of the polysilicon 25. □ represents a boundary point P and identification numbers 0 to 6 are given to the boundary points P respectively. The boundary point P is arranged at higher densities on solid lines considered to be significantly changed in topography. In the simulation example 1, many boundary points P are arranged in the vicinity of the corners of the polysilicon. A solid line between each boundary point P is a line segment s. Identification numbers 0 to 6 are also given to the line segments s respectively. In the step S22, the respective lengths $l_1$ to $l_6$ of six line segments s are calculated and stored. At this time, the data is stored in the data structure as shown in FIG. 17. In the zone 41, identification numbers 0 to 6 are placed. In the zone 42, position coordinates (x, y) of every boundary point P are input every component corresponding to each number. In the zone 44, the lengths $l_1$ to $l_6$ are input corresponding to each number of the line segments s. In the zone 43, since the displacements are accumulated, all displacement components in the zone was reset to 0.

In the step S23, 1 is added to the present number j of steps to set the number of steps to 1. In the step S24, displacement components Ux and Uy of each of the boundary points $P_1$ to $P_6$ are calculated. As shown in FIG. 18, the calculated displacement component is added to the already reset value 0 every number and every component in the zone 43. In the step S25, the boundary point P is moved in the same manner as in the steps S2 to S8 shown in FIG. 8. In this simulation example 1, because each displacement of the boundary points $P_1$ to $P_6$ is larger than the displacement tolerance ($l_{tol}$), these boundary points $P_1$ to $P_6$ are moved as shown by the arrow in FIG. 16 to obtain each Δ mark. In the data structure, as shown in FIG. 18, the displacement component is added to the position coordinate component every number and every component. To state in more detail, in the case of the position coordinate x of the number 0, $x_0'$ is found by calculation from the equation: $x_0+u_{x0}=x_0'$ and the obtained $x_0'$ is stored in the zone of the position coordinate x of the number 0 as shown in FIG. 19. The above process is based on the step S5 of FIG. 8. In succession, in the step S6, the zone 43 is cleared and set to 0 as shown in FIG. 19.

In the step S26 shown in FIG. 10, the length of the line segment s is regulated. For the regulation of the length, the flowchart of FIG. 11 used to add a boundary point is used. In the step S31, the respective lengths $r_1$ to $r_6$ of the line segments $s_1$ to $s_6$ after the boundary point P is moved are calculated. Then, the lengths $r_1$ to $r_6$ are arranged in the zone 45 of FIG. 19. In the step S32, the identification number i of the line segment s is set to 1. In the step S33, whether or not the length $r_1$ is more than a value $\alpha \times l_1$ obtained by multiplying the length $l_1$ before the boundary point is moved by a factor α is judged. In this simulation example 1, α is assumed as 1.8. Since the equation $r_1 \geq \alpha \times l_1$ is not valid, next the step S36 is carried out, so that the identification number i is set to 2. In the step S37, the flow is returned to the step S33. The process involving the step S33 to the step S36 is repeated until the identification number i of the line segment s is equal to 6.

In this simulation example 1, when the identification number i is 3 and 4, $r_1 \geq \alpha \times l_1$. For example, when the number i is 3, the judgment in step S33 is YES. So, a new boundary point $P_3$ is added to the line segment $s_3$ in the step S34 and the lengths $l_3'$ and $l_4'$ of each of two line segments s generated by dividing the line segment $s_1$ are stored in the step S35. In the data structure, as shown in FIG. 20, the coordinates $x_7'$ and $y_7'$ of the new boundary point $P_3$ are generated and the generated coordinates are inserted in the zone of the coordinates of the number 3. When these coordinates are inserted, the zones of the position coordinates of the series of numbers successive to and including the number 3 are displacemented to the zones of the series of numbers successive to and including the number 4. The lengths $l_3'$ and $l_4'$ are arranged in the zone 46. The line segment $s_4$ is subjected to the same process to obtain the dotted line of FIG. 16 and the data structure of FIG. 20. Finally, the data of the zone 46 is overwritten on the zone 44 to make the state of the data structure of FIG. 20 equal to that of the data structure of FIG. 17.

Figure 21:
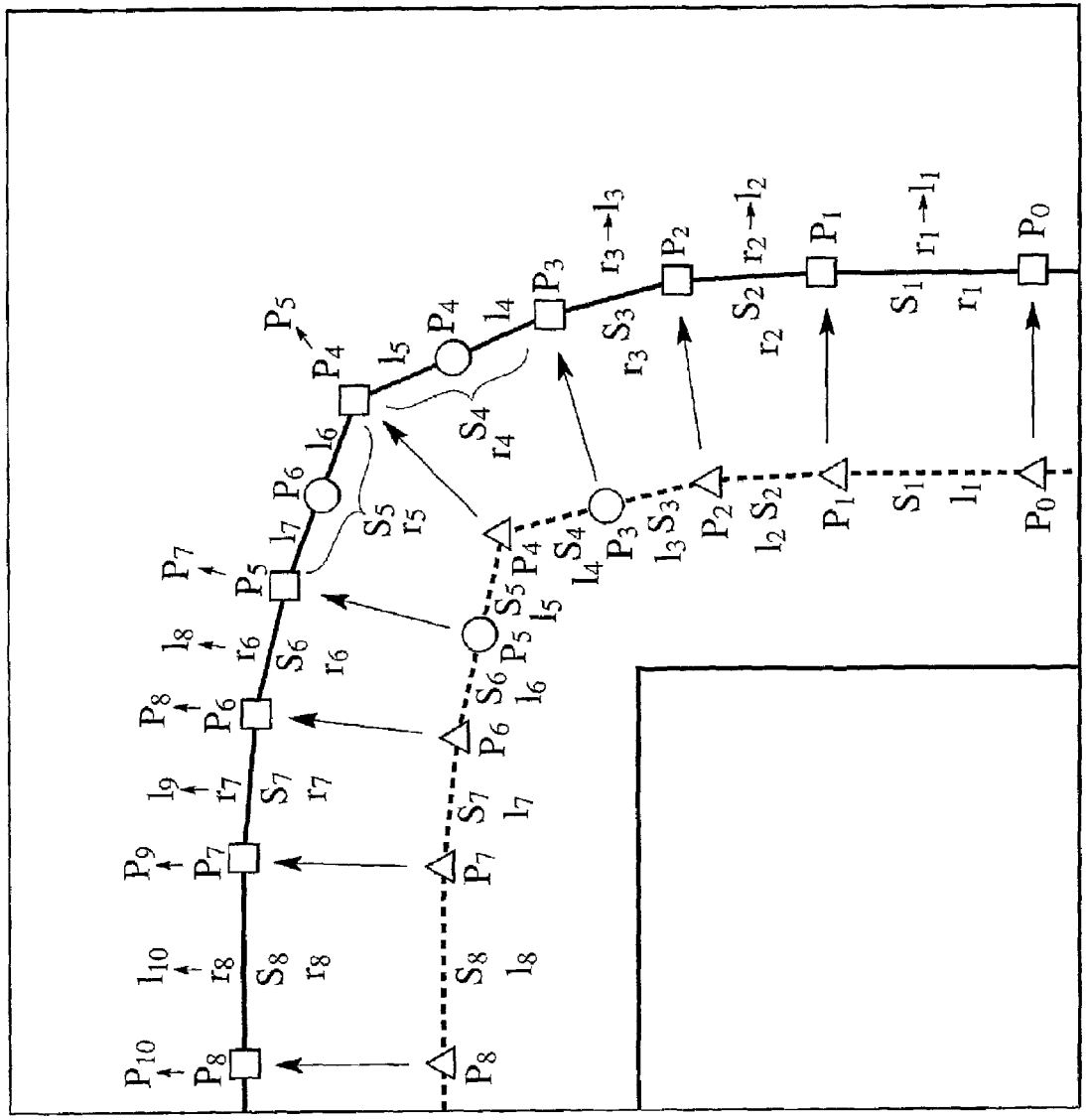
Figure 22:
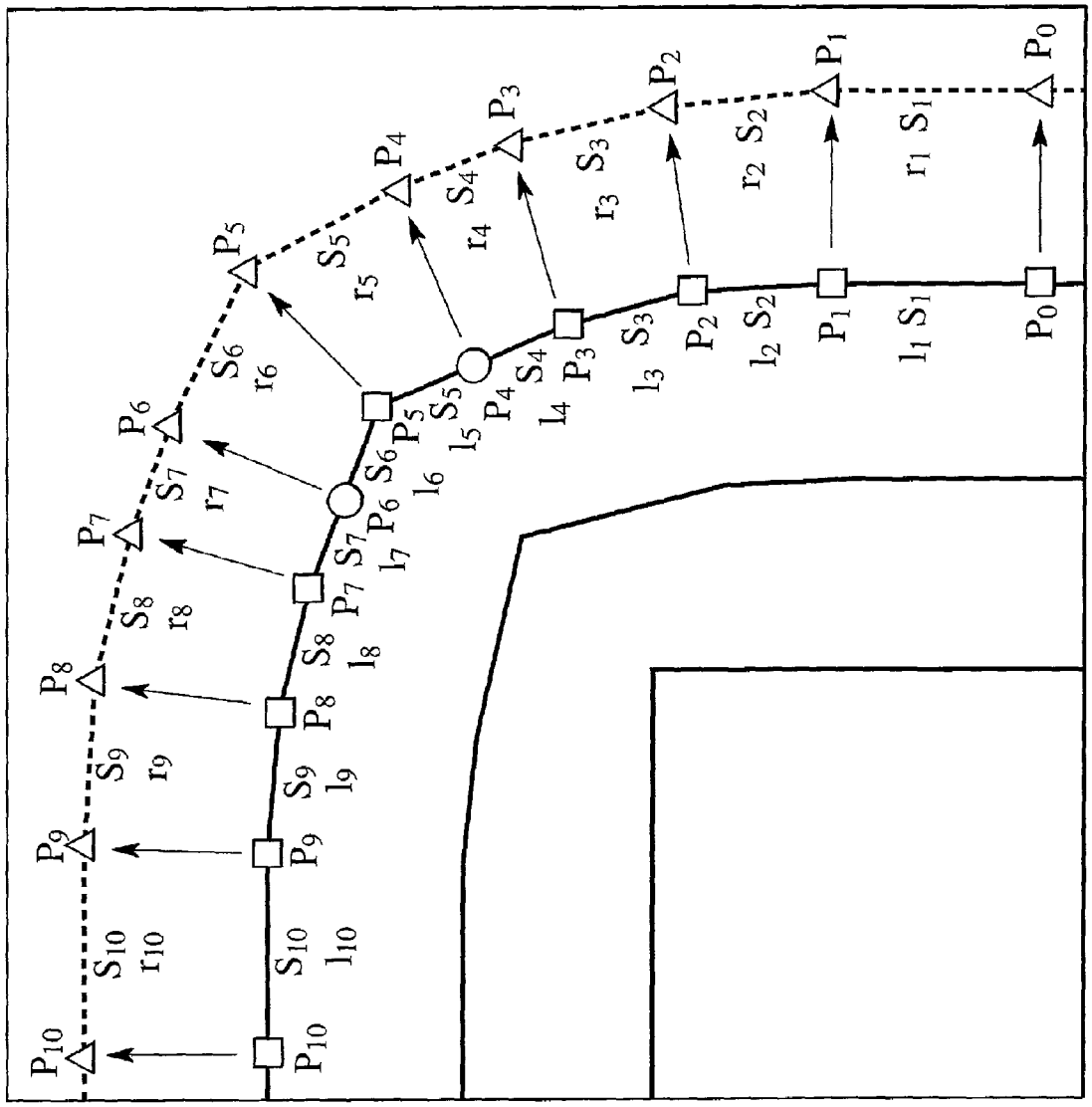

The step S26 of FIG. 10 is finished and in the step S27, whether or not the present number of steps, namely, 1 reaches 3 which is the number $n_{loop}$ of steps is judged. Since the present number does not reach the number $n_{loop}$, the flow is returned to the step S23 to set the number j of steps to 2. Thereafter, the steps S24, S25 and S26 are carried out in the same manner as in the case where j=1 to obtain the solid line segment connected through □ and ○ as shown in FIG. 21. Finally, j is set to 3 and the same process is carried out in the same manner as in the case where j=1 to obtain the dotted line segment connected through Δ as shown in FIG. 22. This dotted line segment shows the topography of the film 27 shown in FIG. 15B. It is to be noted that the change of j signifies a transition of time and the string obtained by connecting a line segment obtained every j shows the topography obtained at the time corresponding to j. By applying the present invention, the length of a line segment after a boundary point is moved can be most properly regulated and the topography of the nitride film 27 at the corner portions of the gate polysilicon can be simulated with high accuracy.

(Simulation Example 2 of the Embodiment)

Figure 5A:
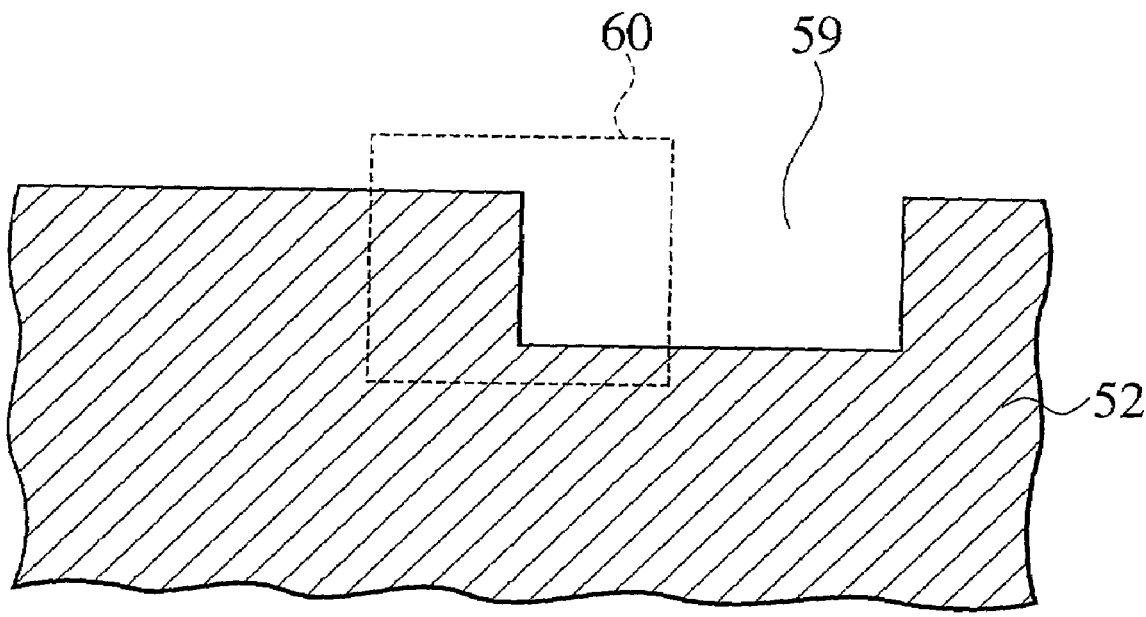
FIG. 5A and FIG. 5B are views for explaining the state of a silicon oxide film formed in a trench to which a simulation method is applied.
Figure 5B:
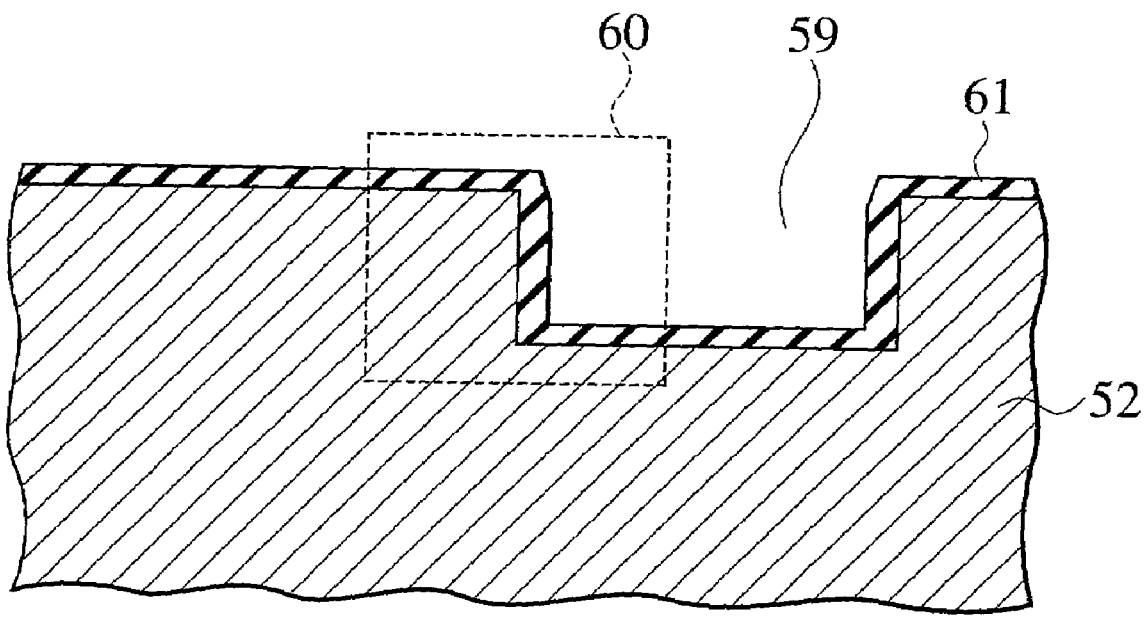

Explanations will be given as to a topography processing method in the case of applying the embodiment to a simulation of a step of depositing a silicon oxide film on a groove formed on a silicon substrate. In the simulation example 2, as shown in FIG. 5A, a groove 59 is formed on a silicon substrate 52. A square 60 represents a simulation region subject to calculation this time. As shown in FIG. 5B, a silicon oxide film 61 is formed on the surface of the silicon substrate 52 including the internal surface of the groove 59. Hereinafter, this filming step is simulated to determine the topography of the film 61 generated in the region 60.

Figure 1B:
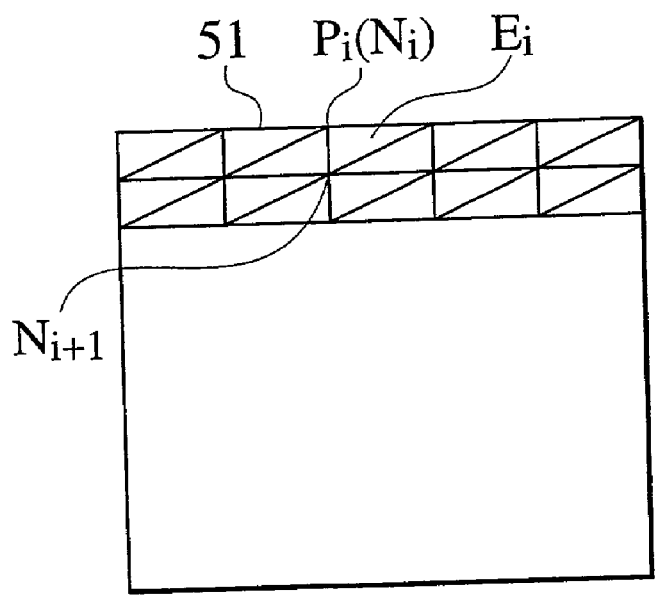
Figure 3:
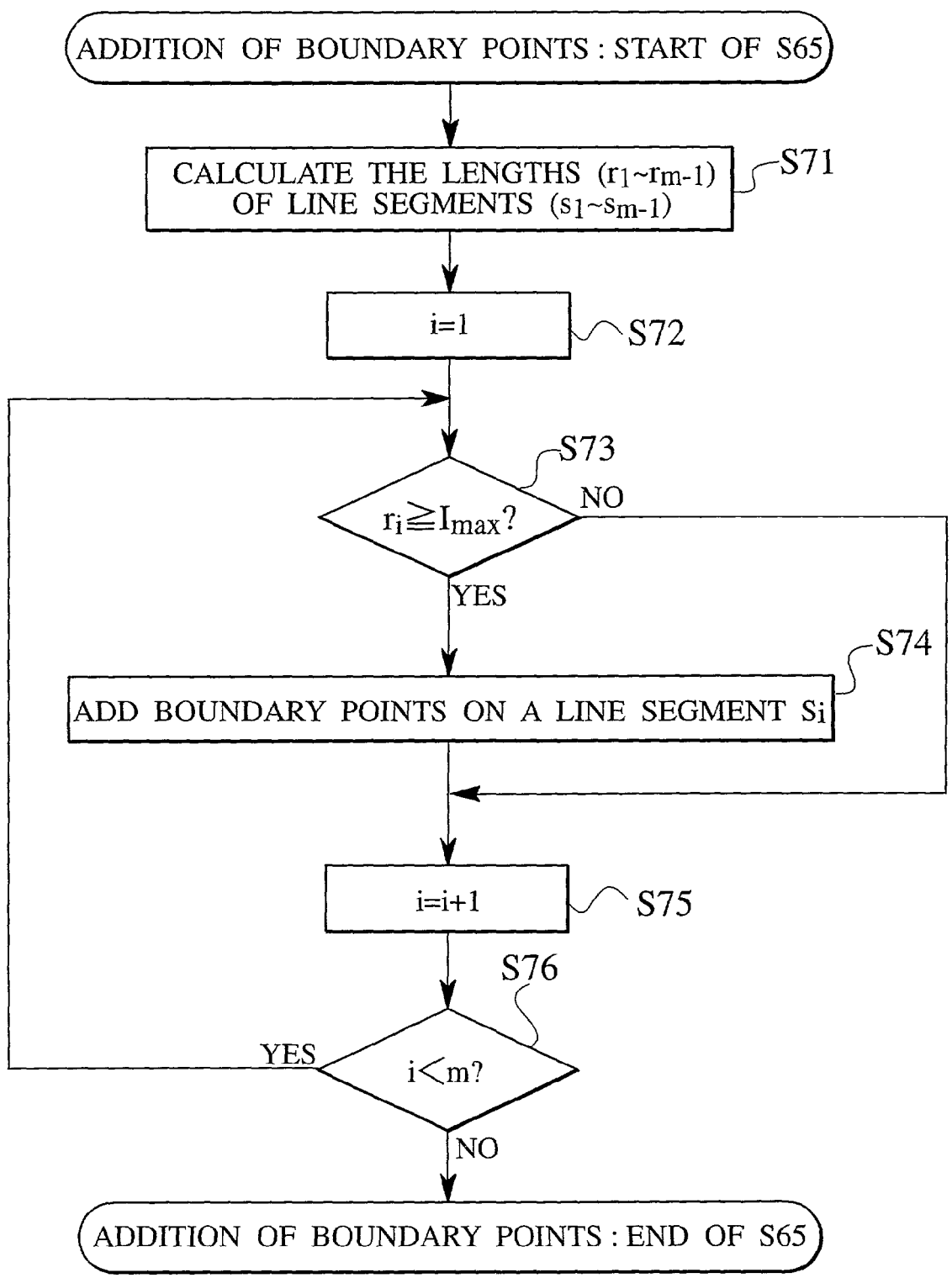
Figure 4:
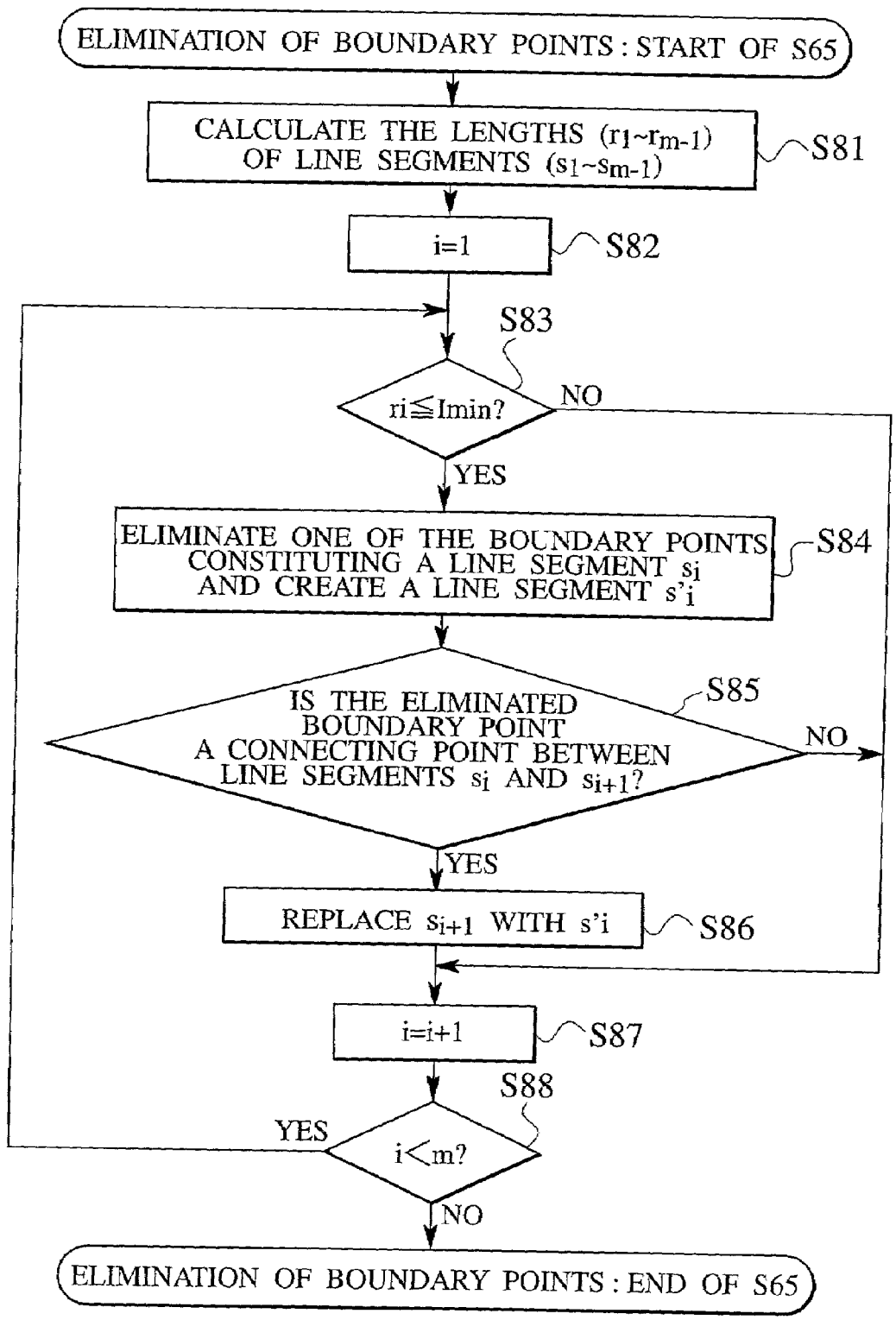

Flowcharts used for the simulation are FIG. 8, FIG. 10, FIG. 11 and FIG. 12. The chart of FIG. 10 is used for a main routine and the flowcharts of FIG. 8, FIG. 11 and FIG. 12 are used for a subroutine. Because, in this example 2, the flowcharts of FIG. 11 and FIG. 12 are used to regulate a length, these flowcharts of FIG. 11 and FIG. 12 may be united to form a new flowchart, which may also be used in this example 2. Specifically, the steps S31, S32, S36 and S37 of FIG. 11 and the steps S41, S42, S48 and S49 are unified respectively and the obtained steps are defined as steps S31, S32, S36 and S37. Then, the cases of judgment in the step S33 of FIG. 1 and in the step S43 of FIG. 12 are united into three cases of judgment. A first case is the case where the judgment is YES in the step S33. In this case, the steps S34, S35 and S36 are carried out in this order. A second case is the case where the judgment is YES in the step S43. In this case, the steps S44, S45, S46, S47 and S36 are carried out in this order. Finally, a third case is the case where the judgment is NO in any of the steps S33 and S43. In this case, the step S36 is carried out eventually.

First, in the step S21 of FIG. 10, the number $n_{loop}$ of steps for the calculation of a displacement is set to 1 and the present number j of steps is set to 0.

Figure 23:
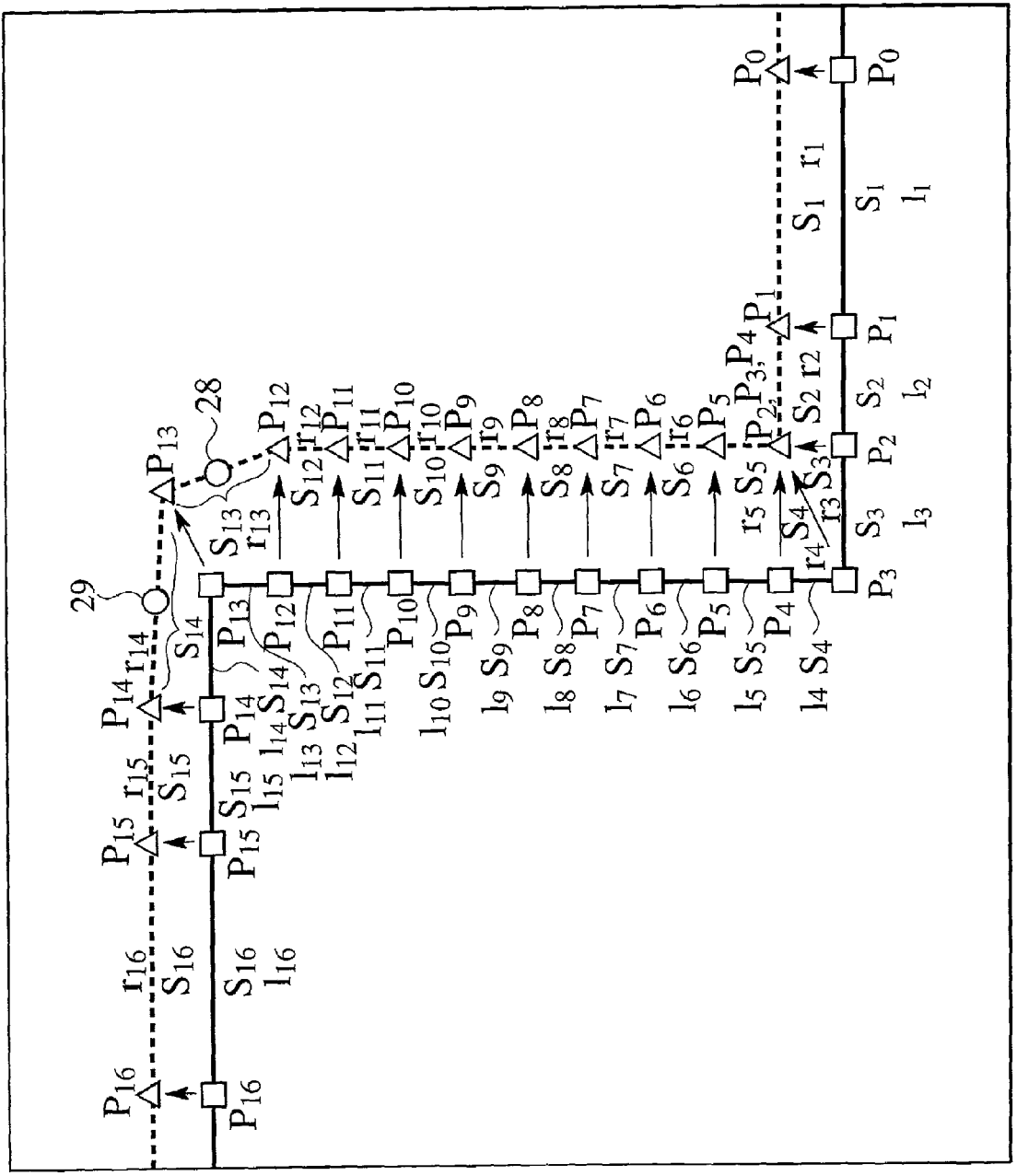
FIG. 23 is a view for explaining a simulation method according to an embodiment of the present invention, the method being applied to the topography of a silicon nitride film formed in a trench of a simulation example 2.

Next, a string connecting the solid line of FIG. 23 through □ is generated. The position of the solid line is made to accord to the surface of the substrate 52. □ represents a boundary point P. Identification numbers 0 to 16 are respectively given in order to each boundary point P. Each boundary point P is arranged on the solid line in closer contact at the side surface of the groove 59 and its vicinity where the topography is considered to be significantly changed. On the contrary, each topography between the boundary points P0 and P1 and between the boundary points P15 and P16 is considered to be able to be estimated from each displacement between the boundary points P0 and P1 and between the boundary points P15 and P16 respectively and no node is arranged between the boundary points P0 and P1 and between the boundary points P15 and P16, whereby it is expected to shorten calculation time. The solid line between each boundary point P is a line segment s. Identification numbers 1 to 16 are also given to each line segment s. In the step S22, the respective lengths $l_1$ to $l_{16}$ of 16 line segments s are calculated and stored.

In the step S23, 1 is added to the present number j of steps to set the number of steps to 1. In the step S24, the displacement components Ux and Uy of each of the boundary points $P_1$ to $P_{16}$ are calculated. In the step S25, the boundary point P is moved in the same manner as in the steps S2 to S8 shown in FIG. 8. In this example, each displacement of the boundary points $P_1$ to $P_{16}$ is larger than the displacement tolerance ($l_{tol}$), these boundary points $P_1$ to $P_{16}$ are moved as shown by the arrow in FIG. 23 to obtain each Δ mark.

In the step S26 shown in FIG. 10, the length of the line segment s is regulated. When the length is regulated, the above flowchart obtained by uniting the flowchart of FIG. 11 with the flowchart of FIG. 12 is used. In the step S31, the respective lengths $r_1$ to $r_{16}$ of the line segments $s_1$ to $S_{16}$ after the boundary point P is moved are calculated. In the step S32, the identification number i of the line segment s is set to 1. In the steps S33 and S43, whether the length $r_1$ is more than $\alpha \times l_1$ (the first case) or less than $\beta \times l_1$ (the second case) or neither more than $\alpha \times l_1$ nor less than $\beta \times l_1$ (the third case) is judged. In this example, α is set to 1.2 and β is set to 0.5 and hence, $r_1$ fits the third case. Therefore the step S36 is then carried out and the identification number i is set to 2. In the step S37, the flow is returned to the step S33. The process involving the above steps S33 to S36 is repeated until the identification number i of the line segment is equal to 16.

In this simulation example 2, the first case where r is larger than α×l is the case where the identification number i is 13 and 14. For example, in the case where i is 13, the judgment is YES in the step S33, a new boundary point 28 is added to the line segment $s_{13}$ in the step S34 as shown in FIG. 23 and the lengths of each of two line segments s obtained by dividing the line segment $s_{13}$ are stored.

In this simulation example 2, the second case where r is smaller than β×l is the case where the identification number i is 3 and 4. For example, when the number i is 3, the judgment is YES in the step S43. Then, in the step S44, the boundary point $P_3$ constituting the line segment $s_3$ is eliminated and a new line segment $s'_3$ is generated. In the step S45, the length $l_3$ of the line segment $s'_3$ is stored. Next, in the steps S46 and S47, if the eliminated boundary point $P_3$ is a boundary point common to the line segments $s_3$ and $s_4$, $s_4$ is replaced with $s'_3$.

The step S26 of FIG. 10 is finished and in the step S27, whether or not the present number of steps, namely, 1 reaches 1 which is the number $n_{loop}$ of steps is judged. Since the present number reaches the number $n_{loop}$, the flow of FIG. 10 is finished. Finally, a line segment shown by the dotted line connected through Δ and ○ is obtained as shown in FIG. 23. This line segment shown by the dotted line shows the topography of the film 61 of FIG. 5B which is intended to be found.

Figure 6:
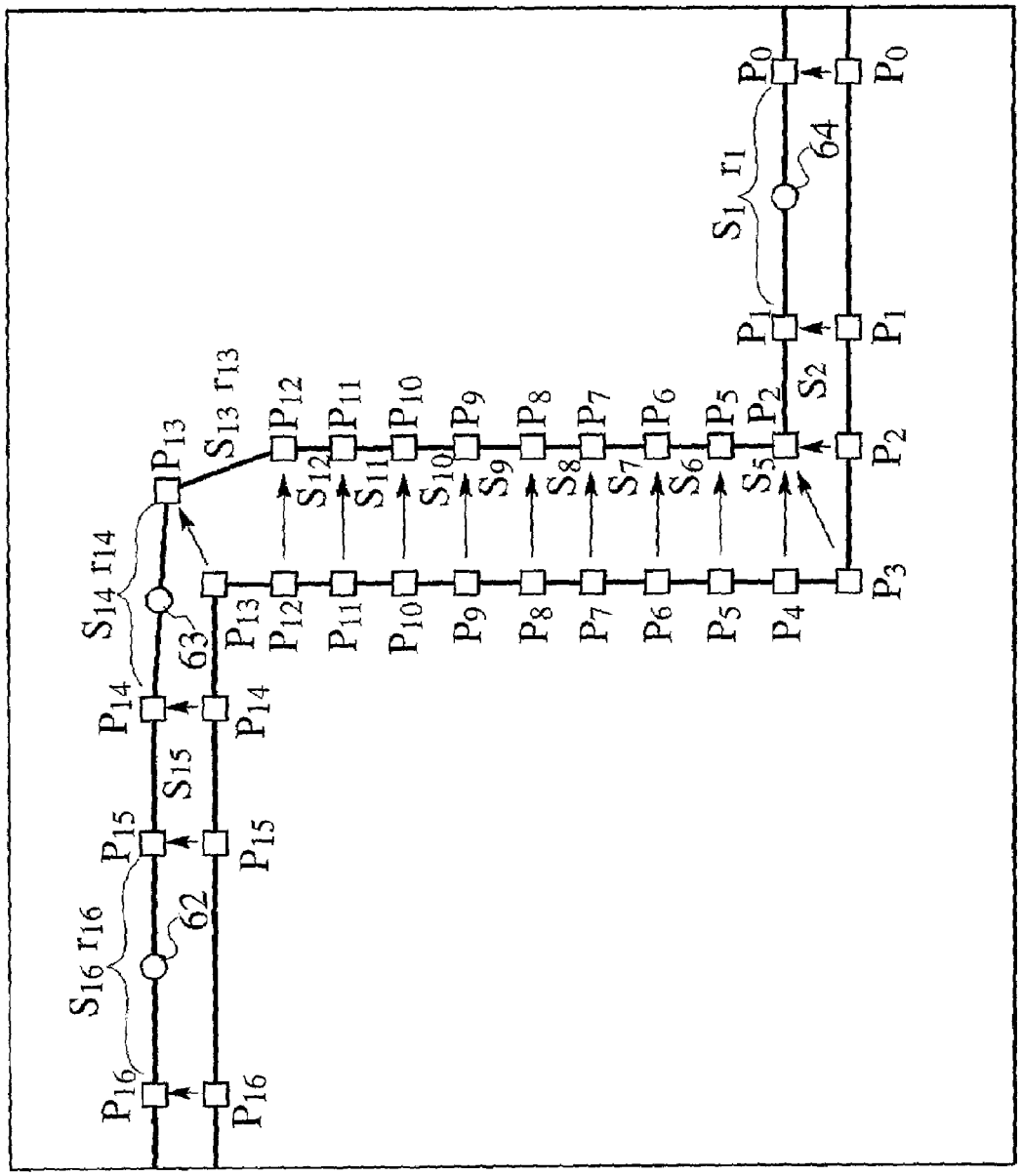
FIG. 6 is a view for explaining a conventional simulation method in which the conventional simulation method is applied to the topography of a silicon oxide film formed in a trench.

As shown in FIG. 23, the boundary points 62 and 64 shown in FIG. 6 are not generated in FIG. 23. This makes it possible to shorten the calculation time. On the other hand, a boundary point which is not generated on the line segment $s_{13}$ in FIG. 6 can be generated as the boundary point 28 in FIG. 23. This enables the accuracy of the topography to be improved. Also, a reduction in processing hours and an improvement in accuracy can be attained at the same time.

In the embodiment, the length of a stored line segment is reset for a new line segment generated by the addition or elimination of a boundary point. However, it is possible to improve the accuracy of calculation by calculating the length of the generated new line segment and setting the calculated value to regulate the length of the line segment. Also, in the case of a three-dimensional simulation, the area of a polygon may be used in place of the length of a line segment. Moreover, the present invention can be applied to topography simulations in steps other than a deposition step.

Various modifications will become possible for those skilled in the art after receiving the teachings of the present disclosure without departing from the scope thereof.

What is claimed is:

1. A computer-implemented simulation method for simulating topography with a geometrical change of a material comprising:
    generating plural boundary points on a string formed on a surface of the material;
    obtaining a first length of a line segment between the boundary points;
    calculating displacement of the boundary points corresponding to the geometrical change according to a process model;
    moving the boundary points by the displacement;
    obtaining a second length of the line segment between the boundary points after the boundary points are moved; and
    making reference to the first and second lengths to add or eliminate the boundary points.

2. The method as in claim 1, wherein
    said moving the boundary point by the displacement comprises:
    obtaining an accumulated displacement by accumulating the displacement; and
    moving the boundary point by the accumulated displacement when the accumulated displacement is greater than a displacement tolerance and clearing the accumulated displacement.

3. The method as in claim 1, wherein
    said making reference to the first and second lengths to add or eliminate said boundary points comprises:
    adding a new boundary point to said line segment when said second length is greater than a value obtained by multiplying the first length by a first factor exceeding 1; and
    obtaining the first length of a new line segment divided by the new boundary point.

4. The method as in claim 3, wherein the first factor is 4 or less.

5. The method as in claim 1, wherein
    said making reference to the first and second lengths to add or eliminate said boundary points comprises:
    eliminating one of the boundary points of the line segment when the second length is smaller than a value obtained by multiplying the first length by a second factor less than 1; and
    obtaining the first length of a new line segment independent of the eliminated boundary point.

6. The method as in claim 5, wherein the second factor is 0.25 or more.

7. The method as in claim 3, wherein
said making reference to the first and second lengths to add or eliminate the boundary point comprises:
eliminating one of the boundary points of the line segment when the second length is smaller than a value obtained by multiplying the first length by a second factor less than 1; and
obtaining the first length of a new line segment independent of the eliminated boundary point.

8. The method as in claim 7, wherein an inverse of the first factor is the second factor.

9. A computer-implemented simulator for simulating topography with a geometrical change of a material comprising:
a node displacement-calculating section calculating displacement of boundary points formed on a string formed on a surface of the material corresponding to the geometrical change in accordance with a process model;
a node moving section moving the boundary points by the displacement;
a length-calculating section obtaining lengths of a line segment between the boundary points before and after the boundary points are moved; and
a regulating section adding or eliminating the boundary point by making reference to the lengths before and after the boundary points are moved.

10. The simulator as in claim 9, wherein;
said node moving section accumulates the displacement to obtain the accumulated displacement, moves the boundary point by the accumulated displacement when the accumulated displacement is greater than a displacement tolerance and clears the accumulated displacement.

11. The simulator as in claim 9, wherein;
said regulating section adds a new boundary point to the line segment when the length after the boundary points are moved is greater than a value obtained by multiplying the length before the boundary points are moved by a first factor which exceeds 1 and is 4 or less.

12. The simulator as in claim 9, wherein;
said regulating section eliminates one of the boundary points of the line segment when the length after the boundary points are moved is smaller than a value obtained by multiplying the length before the boundary points are moved by a second factor which is 0.25 or more and less than 1.

13. The simulator as in claim 11, wherein;
said regulating section eliminates one of the boundary points of the line segment when the length after the boundary points are moved is smaller than a value obtained by multiplying the length before the boundary points are moved by a second factor which is 0.25 or more and less than 1.

14. The simulator as in claim 13, wherein a inverse of the first factor is the second factor.

15. A program which is executed by a computer for simulating topography with a geometrical change of a material, the program comprising:
obtaining a first length of a line segment between boundary points generated on a surface of the material;
calculating displacement of the boundary points corresponding to the geometrical change according to a process model;
moving the boundary points by the displacement;
obtaining a second length of the line segment between the boundary points after the boundary points are moved; and
making reference to the first and second lengths to add or eliminate the boundary points.

16. The program as in claim 15, wherein
said moving the boundary points by the displacement comprises:
obtaining an accumulated displacement by accumulating the displacement; and
moving the boundary points by the accumulated displacement when the accumulated displacement is greater than a displacement tolerance and clearing the accumulated displacement.

17. The program as in claim 15, wherein
said making reference to the first and second lengths to add or eliminate the boundary points comprises:
adding a new boundary point to the line segment when the second length is greater than a value obtained by multiplying the first length by a first factor which exceed 1 and is 4 or less; and
obtaining the first length of a new line segment divided by the new boundary point.

18. The program as in claim 15, wherein
said making reference to the first and second lengths to add or eliminate the boundary points comprises:
eliminating one of the boundary points of the line segment when the second length is smaller than a value obtained by multiplying the first length by a second factor which is 0.25 or more and less than 1; and
obtaining the first length of a new line segment independent of the eliminated boundary points.

19. The program as in claim 17, wherein
said making reference to the first and second lengths to add or eliminate the boundary points comprises:
eliminating one of the boundary points of the line segment when the second length is smaller than a value obtained by multiplying the first length by a second factor which is 0.25 or more and less than 1; and
obtaining the first length of a new line segment independent of the eliminated boundary points.

20. The program as in claim 19, wherein an inverse of the first factor is the second factor.

21. A computer-implemented simulation method for simulating topography of a semiconductor surface having a geometrical change of a material, comprising:
generating two boundary points on a string formed on the surface of a material;
obtaining a first length of a line segment between the two boundary points;
calculating a displacement of two new boundary points according to a process model;
moving the two boundary points by the displacement to the two new boundary points;
obtaining a second length of a line segment between the two new boundary points after the two boundary points are moved;
comparing the second length to the first length multiplied by a factor to add a new boundary point or to eliminate an existing boundary point to simulate the geometrical change of the material.

* * * * *